US008872333B2

(12) United States Patent
Lopez et al.

(10) Patent No.: US 8,872,333 B2
(45) Date of Patent: Oct. 28, 2014

(54) SYSTEM AND METHOD FOR INTEGRATED WAVEGUIDE PACKAGING

(75) Inventors: Noel A Lopez, Chandler, AZ (US); Michael R Lyons, Gilbert, AZ (US); Dave Laidig, Mesa, AZ (US); Kenneth V Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 154 days.

(21) Appl. No.: 13/311,235

(22) Filed: Dec. 5, 2011

(65) Prior Publication Data

US 2012/0139099 A1 Jun. 7, 2012

Related U.S. Application Data

(63) Continuation-in-part of application No. 12/031,236, filed on Feb. 14, 2008, now Pat. No. 8,072,065.

(51) Int. Cl.
*H01L 23/34* (2006.01)
*H05K 1/02* (2006.01)
(Continued)

(52) U.S. Cl.
CPC ....... *H01L 23/13* (2013.01); *H01L 2924/19039* (2013.01); *H01L 2924/19105* (2013.01); *H05K 3/0061* (2013.01); *H01L 24/49* (2013.01); *H01L*
(Continued)

(58) Field of Classification Search
CPC ......... H01L 21/13; H01L 23/66; H01L 24/97; H05K 1/0203; H05K 1/0243

USPC .................... 257/705, 707, 712, 728, E23.01, 257/E21.505
See application file for complete search history.

(56) References Cited

U.S. PATENT DOCUMENTS 5,057,805 A 10/1991 Kadowaki
5,526,525 A 6/1996 Minowa et al.
(Continued)

FOREIGN PATENT DOCUMENTS

EP       1227578       7/2002
KR    1020030032019    9/2003
(Continued)

OTHER PUBLICATIONS

EP; Supplemental Search Report dated Nov. 30, 2011 in Application No. 09711044.9.

(Continued)

*Primary Examiner* — Ermias Woldegeorgis
(74) *Attorney, Agent, or Firm* — Snell & Wilmer L.L.P.

(57) ABSTRACT

A millimeter wave integrated waveguide interface package device may comprise: (1) a package comprising a printed wiring board (PWB) and a monolithic microwave integrate circuit (MMIC), wherein the MMIC is in communication with the PWB; and (2) a waveguide interface integrated with the package. The package may be adapted to operate at high frequency and high power, where high frequency includes frequencies greater than about 5 GHz, and high power includes power greater than about 0.5 W.

19 Claims, 23 Drawing Sheets

(51) Int. Cl.
*H01L 23/13* (2006.01)
*H01L 23/66* (2006.01)
H05K 3/00 (2006.01)
H01L 23/00 (2006.01)
H01L 23/40 (2006.01)

(52) U.S. Cl.
CPC .............. 2924/01029 (2013.01); *H05K 1/0203* (2013.01); *H01L 2924/01013* (2013.01); *H01L 24/97* (2013.01); *H05K 2201/09845* (2013.01); *H01L 2924/01079* (2013.01); *H01L 2224/97* (2013.01); *H01L 2924/14* (2013.01); *H01L 2224/32245* (2013.01); *H01L 2224/48227* (2013.01); *H01L 23/4006* (2013.01); *H01L 2224/49175* (2013.01); *H01L 2223/6633* (2013.01); *H01L 2924/014* (2013.01); *H01L 2924/1423* (2013.01); *H01L 2924/01033* (2013.01); *H01L 2924/19041* (2013.01); *H01L 2924/01082* (2013.01); *H01L 2924/01074* (2013.01); *H01L 23/66* (2013.01); *H05K 2201/10189* (2013.01); *H01L 2924/15153* (2013.01); *H01L 2924/0103* (2013.01); *H01L 2224/48091* (2013.01); *H01L 2224/2919* (2013.01); *H01L 2223/6683* (2013.01); *H01L 2924/1517* (2013.01); *H01L 24/29* (2013.01); *H01L 2924/01078* (2013.01); *H01L 24/32* (2013.01); *H01L 2924/01027* (2013.01); *H01L 2924/1616* (2013.01); *H01L 2224/49171* (2013.01); *H01L 24/48* (2013.01); *H01L 2924/30107* (2013.01); *H05K 1/0243* (2013.01); *H01L 2924/19043* (2013.01)
USPC ........... 257/728; 257/705; 257/707; 257/712; 257/E23.01; 257/E21.505

(56) References Cited

U.S. PATENT DOCUMENTS

| | | | |
|---|---|---|---|
| 5,530,285 A | 6/1996 | Brenndoerfer | |
| 5,541,565 A | 7/1996 | Dowsing, III et al. | |
| 5,557,144 A | 9/1996 | Rosenstock et al. | |
| 5,663,597 A | 9/1997 | Nelson et al. | |
| 6,078,101 A | 6/2000 | Aizenberg et al. | |
| 6,133,795 A | 10/2000 | Williams | |
| 6,160,454 A | 12/2000 | Buer et al. | |
| 6,201,454 B1 * | 3/2001 | Kinayman et al. | 333/33 |
| 6,208,214 B1 | 3/2001 | Geddes et al. | |
| 6,275,684 B1 | 8/2001 | Kaneko et al. | |
| 6,317,003 B1 | 11/2001 | Kobayashi | |
| 6,442,374 B1 | 8/2002 | Brady et al. | |
| 6,462,628 B2 | 10/2002 | Kondo et al. | |
| 6,483,186 B1 * | 11/2002 | Hsieh et al. | 257/707 |
| 6,508,550 B1 | 1/2003 | Eastlund et al. | |
| 6,535,546 B1 | 3/2003 | Bethscheider et al. | |
| 6,542,035 B2 | 4/2003 | Cook et al. | |
| 6,570,442 B2 | 5/2003 | Nakai et al. | |
| 6,597,925 B1 | 7/2003 | Garcia et al. | |
| 7,035,617 B2 | 4/2006 | Buer et al. | |
| 7,050,765 B2 | 5/2006 | Anmar et al. | |
| 2002/0102959 A1 | 8/2002 | Buer et al. | |
| 2003/0169134 A1 * | 9/2003 | Ammar et al. | 333/247 |
| 2008/0157344 A1 | 7/2008 | Chen et al. | |
| 2009/0051018 A1 | 2/2009 | Moline | |
| 2010/0038776 A1 | 2/2010 | Bessemoulin | |

FOREIGN PATENT DOCUMENTS

| | | |
|---|---|---|
| KR | 1020040010573 | 1/2004 |
| WO | 0249103 | 6/2002 |
| WO | 03079565 | 9/2003 |

OTHER PUBLICATIONS

USPTO; Notice of Allowance dated Aug. 3, 2011 in U.S. Appl. No. 12/031,236.
USPTO; Final Office Action dated Jun. 9, 2011 in U.S. Appl. No. 12/031,236.
USPTO; Office Action dated Dec. 22, 2010 in U.S. Appl. No. 12/031,236.
USPTO; Office Action Restriction dated Sep. 27, 2010 in U.S. Appl. No. 12/031,236.
PCT; International Preliminary Report on Patentability dated Aug. 17, 2010 in Application No. PCT/US2009/033681.
PCT; International Search Report and Written Opinion dated Aug. 27, 2009 in Application No. PCT/US2009/033681.
USPTO; Notice of Allowance dated Nov. 18, 2005 in US U.S. Appl. No. 10/066,024.
USPTO; Office Action dated Jul. 27, 2005 in U.S. Appl. No. 10/066,024.
USPTO; Office Action dated May 25, 2004 in U.S. Appl. No. 10/066,024.
USPTO; Office Action dated Jan. 10, 2005 in U.S. Appl. No. 10/066,024.
GB; Search Report dated Jan. 23, 2012 in Application No. GB1114988.7.
Notice of Allowance dated Jul. 19, 2013 in U.S. Appl. No. 13/221,693.
Notice of Intention to Granted dated Sep. 20, 2013 in European Application No. 09711044.9.
Office Action dated Feb. 6, 2013 in U.S. Appl. No. 13/221,693.
Examination Report dated Mar. 28, 2014 in Australian Application No. 2011218651.
Decision to Grant dated Apr. 10, 2014 in European Application No. 09711044.9.
Examination Report dated Jan. 31, 2014 in UK Application No. GB1114988.7.
Intention to Grant dated Dec. 17, 2013 in European Application No. 09711044.9.

* cited by examiner

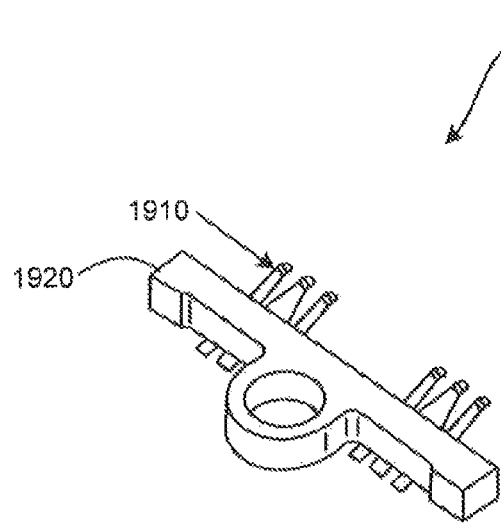
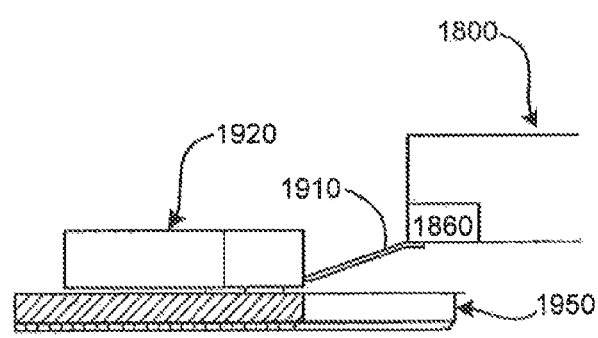
FIG. 19A
FIG. 19B

SYSTEM AND METHOD FOR INTEGRATED WAVEGUIDE PACKAGING

CROSS-REFERENCE TO RELATED APPLICATIONS

This application is a continuation-in-part application of U.S. application Ser. No. 12/031,236, entitled "SYSTEM AND METHOD FOR INTEGRATED WAVEGUIDE PACKAGING," which was filed on Feb. 14, 2008, the contents of which are hereby incorporated by reference for any purpose in their entirety.

FIELD OF INVENTION

The present invention relates to millimeter wave packaging. More particularly, the invention relates to millimeter wave packaging manufactured using low cost and/or high yield techniques.

BACKGROUND

Block up converters (BUCs), solid state power amplifiers (SSPAs), and similar systems are often employed in satellite communications systems to transmit and receive data by means of radio frequency (RF) signals. Many of these systems employ millimeter wave packaging including various components that provide needed functionality within the systems. For example, BUCs and SSPAs may comprise electrical and mechanical components such as monolithic microwave integrated circuits (MMICs), heat spreaders, printed wire boards (PWBs) or other similar structures, waveguides, chassis, RF covers, and/or various other components. Such components cooperate to reliably process RF signals in a productive manner consistent with the purposes of the particular system with which the components are associated.

Some electronics modules including needed electrical components are manufactured in various combinations using a variety of methods. For example, some medium power BUCs (mBUCs) are manufactured using custom aluminum cast chassis and covers. Custom cast chassis and covers can be relatively expensive. Some mBUCs are manufactured using PWBs that are assembled separate from cast chassis and covers. The cast chassis, cast covers, and other components are then later assembled with individual PWBs in a serial manufacturing process. A serial manufacturing process that assembles only one millimeter wave package at a time can be inefficient and expensive.

SUMMARY

In various embodiments, a millimeter wave integrated waveguide interface package device may comprise: (1) a package comprising a printed wiring board (PWB) and a monolithic microwave integrate circuit (MMIC), wherein the MMIC is in communication with the PWB; and (2) a waveguide interface integrated with the package.

In another embodiment, a millimeter wave integrated waveguide interface package device may comprise: (1) a package comprising a printed wiring board (PWB) and a monolithic microwave integrate circuit (MMIC), wherein the MMIC is in communication with the PWB; and (2) a waveguide interface integrated with the package; wherein the package is adapted to operate at high frequency and high power, and wherein high frequency includes frequencies greater than about 5 GHz, and wherein high power includes power greater than about 0.5 W.

In yet another embodiment, a millimeter wave integrated waveguide interface package device may comprise: (1) a monolithic microwave integrate circuit (MMIC); (2) a printed wiring board (PWB), wherein the PWB comprises a MMIC opening, and wherein the PWB comprises a waveguide interface opening; (3) a heat spreader attached to one side of the PWB, wherein the MMIC is located in thermal communication with the heat spreader and within the MMIC opening in the PWB, and wherein the MMIC is in electrical communication with the PWB; and (4) a radio frequency (RF) probe in contact with the PWB, wherein the RF probe is electrically connected to an output of the MMIC, and wherein the RF probe extends out over the waveguide interface opening so as to be configured to launch an RF signal through the waveguide interface opening; wherein the device is adapted to operate at high frequency and high power, and wherein high frequency includes frequencies greater than about 5 GHz, and wherein high power includes power greater than about 0.5 W.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

FIG. 19 shows perspective and side views of an example spring connector;

DETAILED DESCRIPTION

While various embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
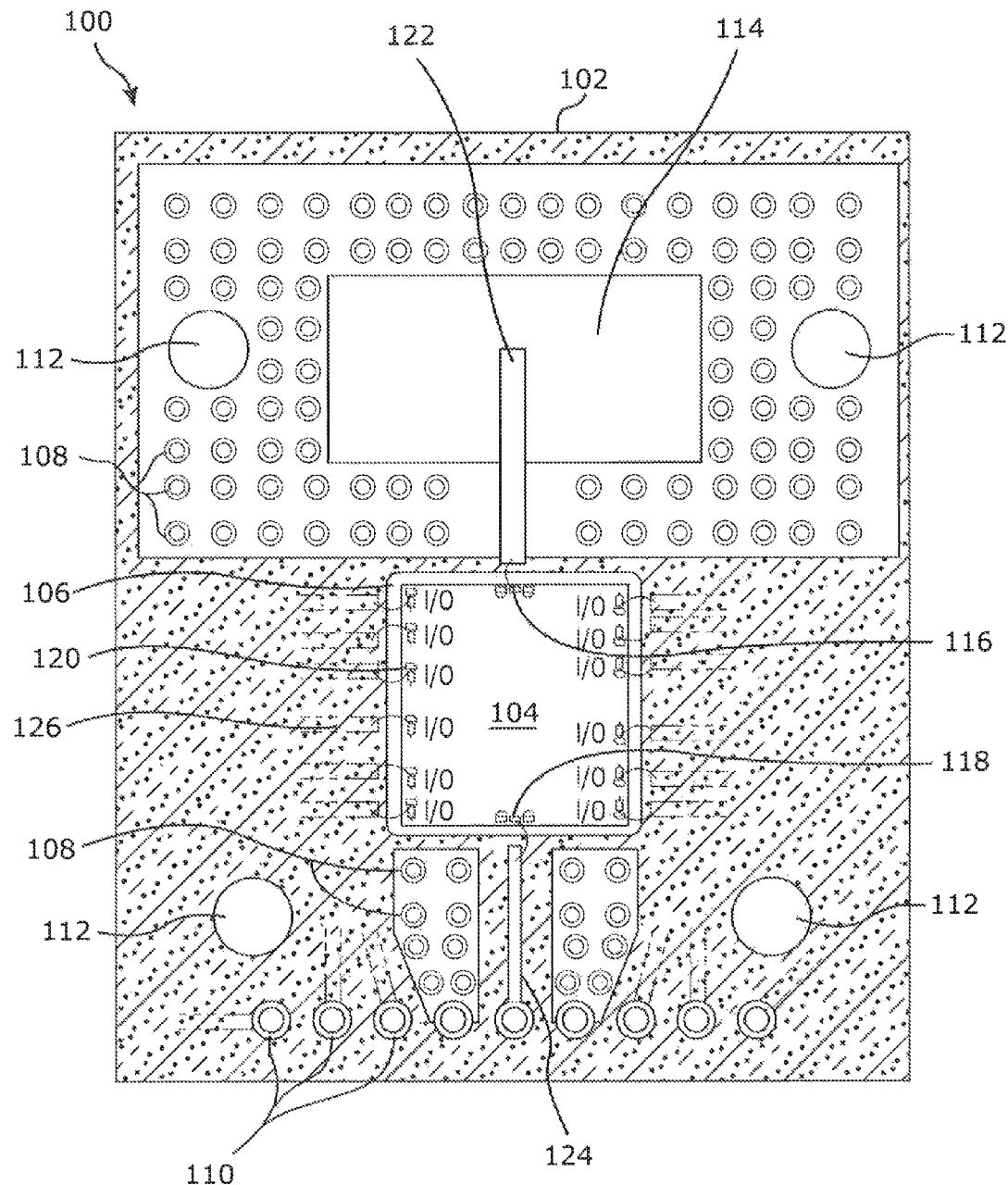
FIG. 1 shows a top view of an example of a millimeter wave package with a radio frequency (RF) cover removed.

In accordance with an example of a millimeter waveguide package, and with reference to FIG. 1, a top view of a millimeter waveguide package 100 is shown with the radio frequency (RF) cover removed. The package 100 is an example of a reliable and low cost millimeter wave package, capable of being manufactured in parallel with other packages 100 in relatively high volumes, with desired microwave interfaces and thermal management. The package 100 includes a printed wiring board (PWB) 102 in communication with a monolithic microwave integrated circuit (MMIC) 104. PWB 102 includes a space 106, multiple vias 108, mating vias 110, holes 112, and a waveguide interface 114.

The PWB 102 may have one or more layers depending on the number of signals routed through the package 100 or other needs and preferences. The PWB 102 may be a printed wiring board, printed circuit board, etched wiring board, low temperature co-fired ceramic, high temperature co-fired ceramic, laminate, soft-substrate, liquid crystal polymer, and/or other similar structure. The PWB 102 may include various vias, through hole components, and surface mount technology (SMT). SMT may be mounted to the top or bottom side of the PWB 102 with solder, epoxy, or other type of attachment.

The MMIC 104 resides within the space 106 such that the MMIC 104 is capable of communicating with the top surface of the PWB 102. The MMIC 104 communicates with the PWB 102 in a manner that enables the MMIC 104 to ultimately communicate with one or more additional packages 100. The signals communicated to and from the MMIC 104 can be RF, local oscillator (LO), intermediate frequency (IF), voltage supplies, control, detector signals, and/or the like.

With reference to FIG. 1, the example of an MMIC 104 may include an RF output 116, an RF input 118, and various input/output ports 120. The RF output 116 is wire bonded or otherwise connected to an RF probe 122. The RF probe 122 extends into the waveguide interface 114. The RF probe 122 may be used to launch an RF signal within the waveguide interface 114. The waveguide interface 114 is configured to provide a low loss interface between the package 100 and its surrounding components and environment. Low loss signal communications are particularly beneficial for certain microwave applications such as high power amplification (HPA) output interfaces and low noise amplification (LNA) input interfaces.

The RF input 118 to the MMIC 104 is wire bonded or otherwise connected to a structure 124. Structure 124 may comprise, for example, a micro-strip 50 Ohm trace. Furthermore, structure 124 may, for example, be any structure capable of communicating a signal to the MMIC 104. The structure or trace 124 may be in turn connected to one of the mating vias 110. The mating vias 110 may be connected or mated through connector pins with the additional vias 108 of a mating package 101 (shown in FIG. 3). The input/output ports 120 of the MMIC 104 are wire bonded or otherwise connected to various traces 126 on the PWB 102.

The holes 112 accommodate bolts, screws, or other connectors that, for example, mechanically, secure or mount the PWB 102 and potentially other components of the package 100 to each other or to one or more additional assemblies or structures. For example, the PWB 102 may be mounted to an adjacent heat spreader plate, chassis, additional PWBs, additional packages 100, or other structures through one or more of the holes 112. Holes 112 may be supplemented or replaced with other attachment structures such as other connections or spaces that provide the needed mechanical attachment among various components associated with the package 100. Secure mechanical connections offer predictable and desired spacing among components in order to maximize optimal thermal connections and signal communications.

Figure 2:
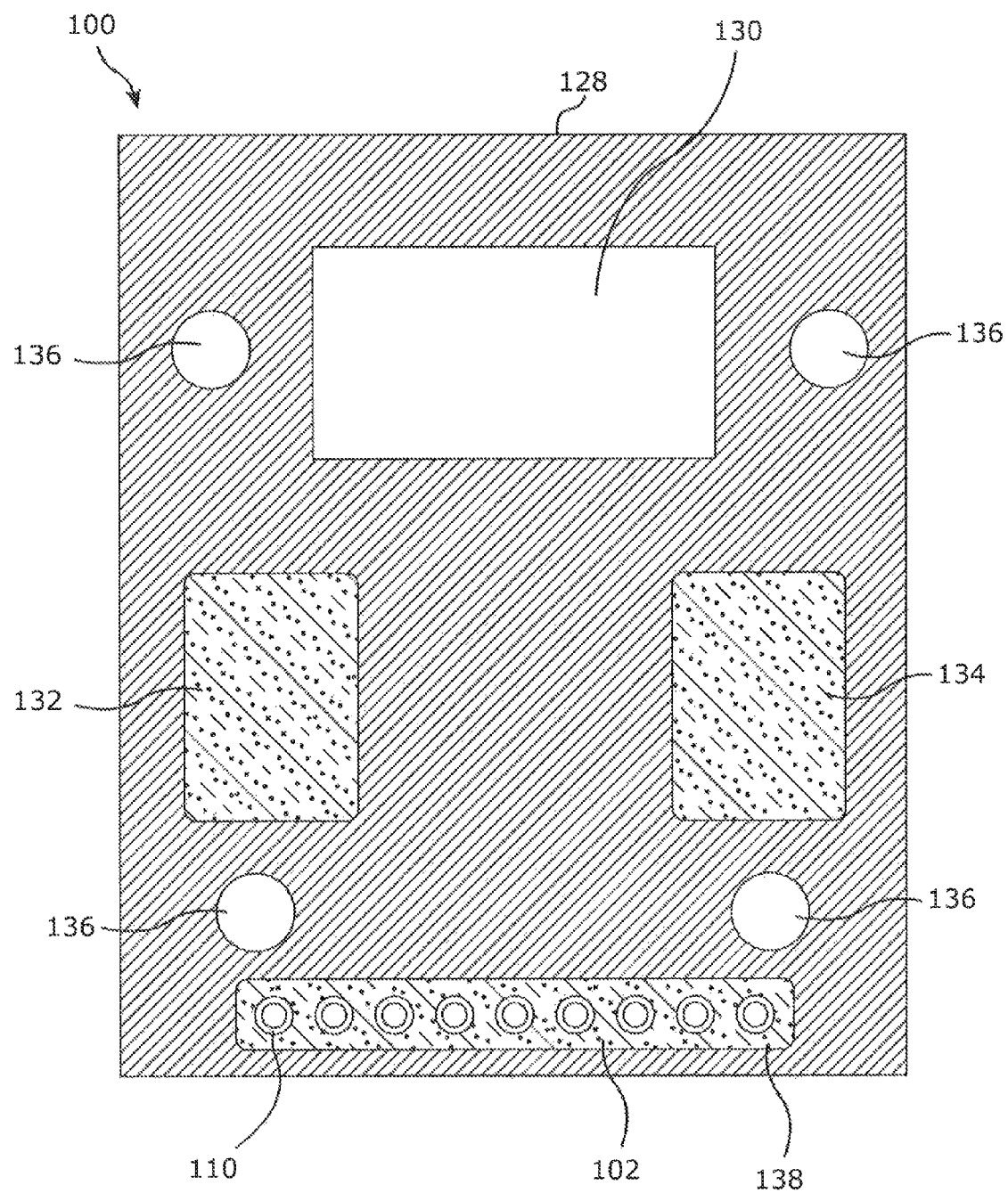
FIG. 2 shows a bottom view of an example of a millimeter wave package.

With reference to FIG. 2, a bottom view of an example of a package 100, such as the package 100 described with reference to FIG. 1, is shown. The package 100 includes a heat spreader 128. The heat spreader 128 may include a waveguide space 130, optional openings 132 and 134 for SMT components to be mounted to a PWB 102 (FIG. 1), one or more holes 136, and/or an opening 138 for mating connector pins to access mating vias 110 of a PWB 102.

The heat spreader 128 may be a heat spreader plate or other structure capable of transferring heat from an MMIC 104 (FIG. 1) or other heat generating component throughout the package 100 and surrounding environment. For example, the heat spreader 128 may be formed of metal or a metal alloy such as copper, aluminum, or other thermally conductive material. Additionally or alternatively, the heat spreader 128 may include one or more fluid spaces capable of receiving heat and transferring the heat within the flow of the fluid. Certain examples of heat spreaders 128 will include, in addition to beneficial thermal properties, beneficial mechanical, RF or other signal communications, electrical, cost-efficient, and other properties that may be preferred depending upon the particular implementation of the package 100.

Figure 3:
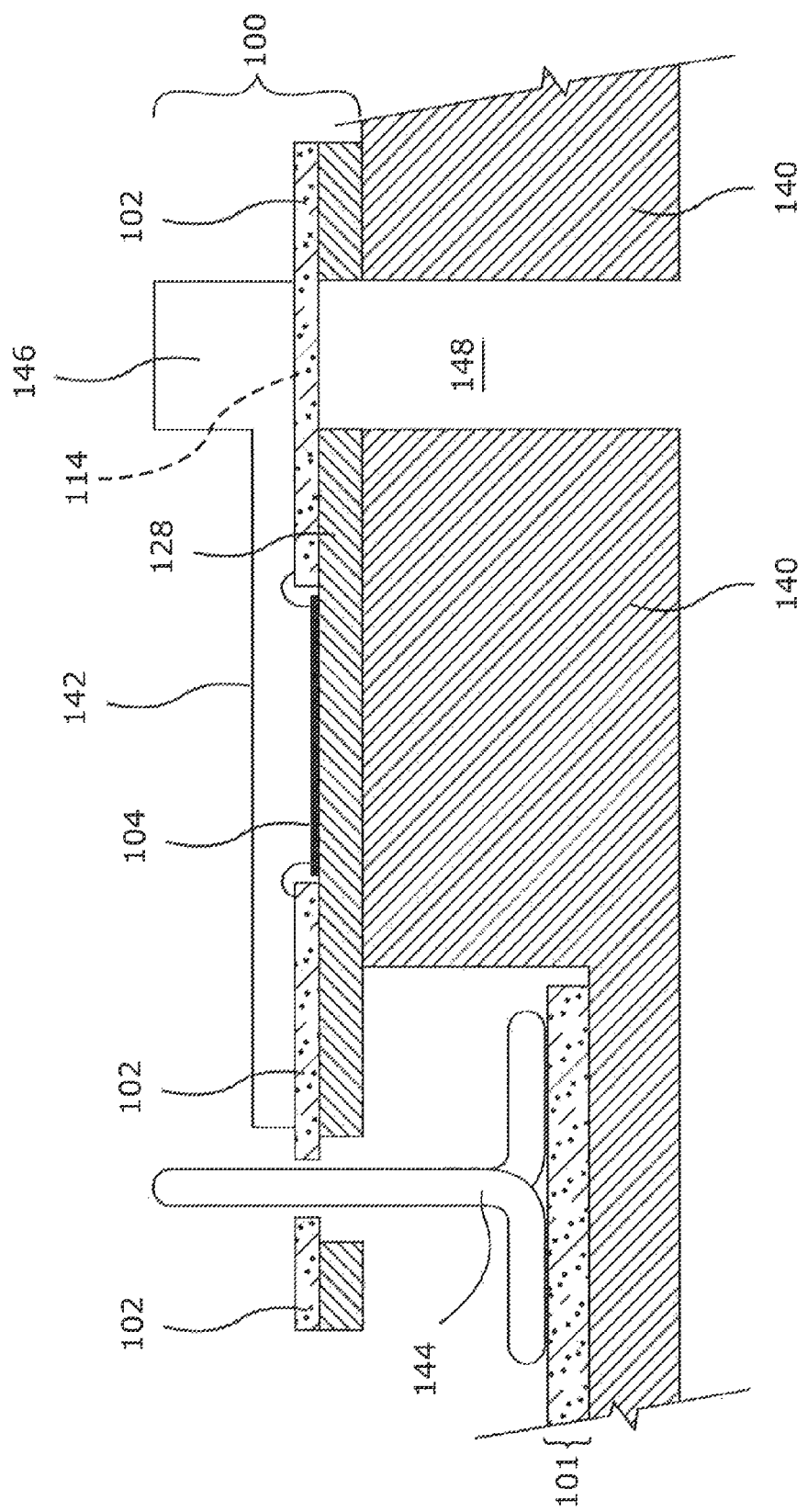
FIG. 3 shows a cross section side view of an example of a millimeter wave package.

With reference to FIG. 3, a cross section side view of an example of a package 100, such as the package 100 described with reference to FIGS. 1 and 2, is shown mounted to a chassis 140 and connected to a mating package 101. The package 100 includes a cover 142, such as an RF cover, connected to, or otherwise in communication with, a PWB 102, a MMIC 104 mounted to a heat spreader 128 and in signal communication with the PWB 102, the heat spreader 128 mounted to the chassis 140, and the package 100 in communication with, or mated to, an additional package 101 using a mating connector 144.

In the example of a package 100, the cover 142 serves as an RF cover. The cover 142 may include a waveguide back short 146, which, in combination with the waveguide interface 114, forms a waveguide interface between the RF probe 122 and the waveguide opening 148. The waveguide back short 146 is sized, oriented, and distanced from the waveguide interface 114 in order to ensure that the waveguide back short 146 redirects RF waves through the waveguide interface in phase. A waveguide back short (also known as "backshort") may be a microstrip-to-waveguide transition. One example backshort may be used in conjunction with an E-plane probe. In this example, the back short is positioned ¼ wavelength away from the probe, and, in receive mode, reflects electro-magnetic (EM) energy that made it past the probe back to the probe where it combines in phase with the incident wave. The waveguide interface includes the waveguide interface 114 and a waveguide opening 148 formed through the chassis 140. The cover 142 may be formed of metalized plastic, polymer, sheet metal, or a similar material formed by stamping, casting, or a similar process. The cover 142 may, for example, be a metalized RF cover with RF channels and a waveguide back short 146. The cover 142 may be attached to the PWB 102 with solder, epoxy or other adhesive, screws or other mechanical connectors, a mechanical interference or snap fit, and/or other attachment structure. In one example, the cover 142 may be coefficient of thermal expansion (CTE) matched to the PWB 102. In another example, the cover 142 may be formed of a high temperature polymer capable of withstanding subsequent steps of a high temperature manufacturing process. Examples of polymers that can be used herein may include liquid crystal polymer (LCP), polyphenylene sulfide (PPS), and polyetherimide (PEI).

In one embodiment, the package 100 may include a waveguide interface on the input and/or output of the package 100. In some embodiments, the minimum number of waveguide interfaces per package 100 is one. In other embodiments, multiple waveguide interfaces may be used as one or more RF interfaces for a single package, in order to produce a package of optimal frequency and size. At lower frequencies, waveguide interfaces can be very large. In various embodiments, package 100 comprises multiple waveguide interface inputs, outputs, or both. In one embodiment, package 100 comprises no inputs, such as where an oscillator is located in package 100.

With reference to FIG. 3, the package 100 may be connected to an adjacent mating package 101. A mating package 101 may include similar or identical structures and may perform similar or identical functions as a package 100. Various structures and methods may be used to connect two or more packages 100 and 101 together. In the example shown in FIG. 3, the mating connector 144 is attached as surface mount technology (SMT) to the vias 108 of the mating package 101. The mating connector 144 also, connects to the mating vias 110 of the next higher package 100, creating an electrical connection between both packages 100 and 101. The two packages 100 and 101 may be RF matched in order to match out or reduce the inductance of the connector 144. A connector such as a standard SMT 2 mm board-to-board header manufactured by Samtec USA of New Albany, Ind. may be used as the connector 144. Furthermore, other suitable connectors 144 may be used. Although the connector of Samtec USA was originally designed for DC and very low frequency control signals, in accordance with an example embodiment such connector is configured for use with the packages 100 and/or 101, for example, for Ka band applications and other frequency ranges.

Figure 4:
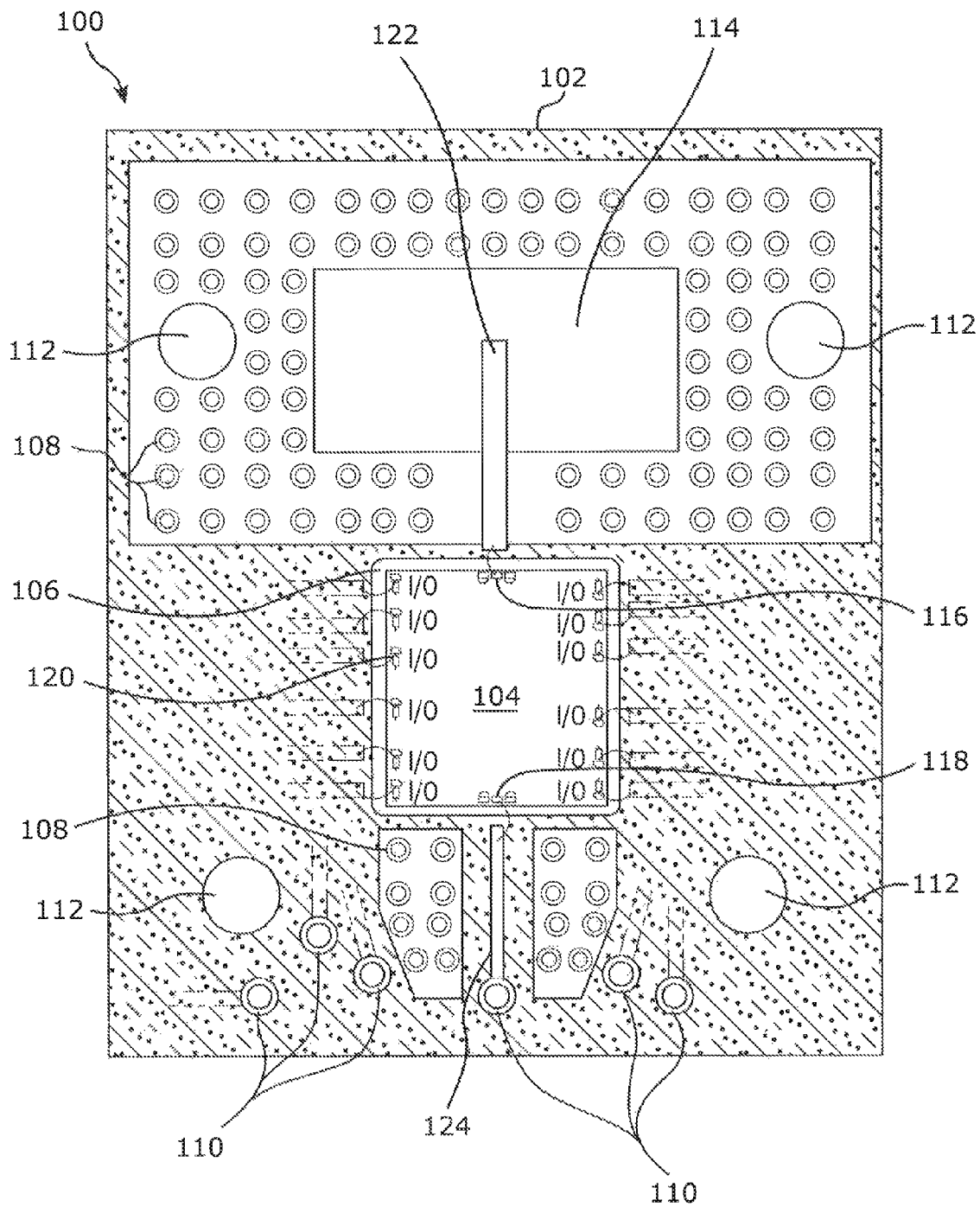
FIG. 4 shows a top view of an example of another millimeter wave package with an RF cover removed.
Figure 5:
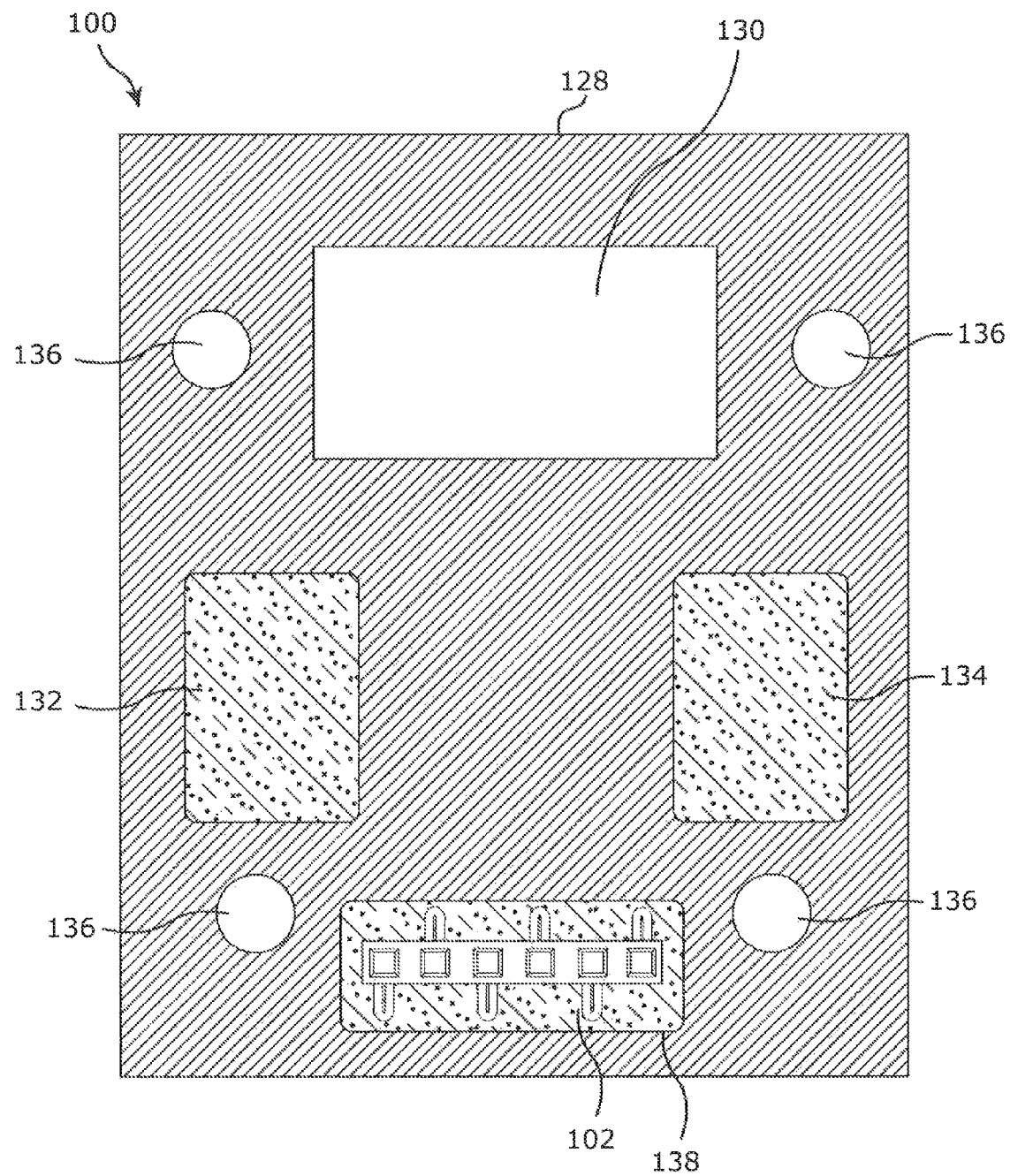
FIG. 5 shows a bottom view of another example of a millimeter wave package.
Figure 6:
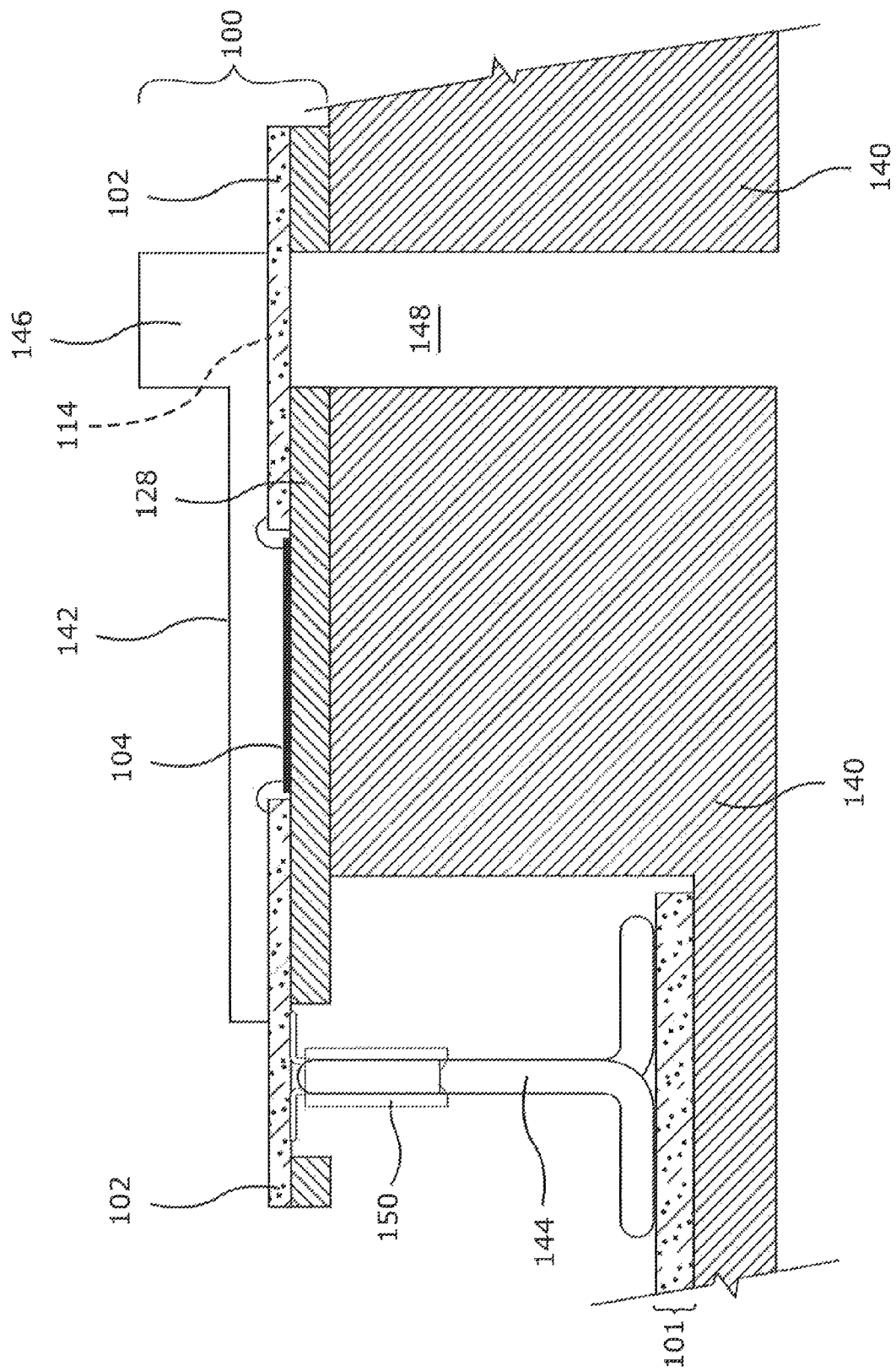
FIG. 6 shows a cross section side view of another example of a millimeter wave package.

With reference to FIGS. 4 through 6, another example of a series of mating packages 100 and 101 includes an alternate connection interface between the packages 100 and 101. Specifically, FIG. 4 is a top view of an example of a millimeter wave package 100 with the RF cover removed. FIG. 4 shows components similar to the components of the package 100 described with reference to FIG. 1, including a PWB 102, MMIC 104, space 106, multiple vias 108, holes 112, waveguide interface 114, RF output 116, RF input 118, various input/output ports 120, RF probe 122, and signal communication structure 124. However, the mating vias 110 described with reference to FIG. 1 are replaced with alternate mating vias 110 in FIG. 4. The mating vias 110 of FIG. 4 accommodate an SMT connector shown in FIG. 5 mounted to the back side of the PWB 102.

With reference to FIG. 5, a bottom view of an example of a millimeter wave package 100 may include components similar to the components described with reference to FIG. 2, including a heat spreader 128, waveguide space 130, optional openings 132 and 134 for SMT components to be mounted to a PWB 102 (FIG. 4), and one or more holes 136. However, the opening 138 described with reference to FIG. 2 is replaced with an alternate opening 138 of different size in FIG. 5. Further FIG. 6 shows a backside female SMT connector 150 connected to mating vias 110 (FIG. 4) and mounted to the bottom side of the PWB 102.

With reference to FIG. 6, a side view of an example of at least one millimeter wave package 100 may include components similar to the components described with reference to FIG. 3, including a package 100 and mating package 101, PWB 102, MMIC 104, waveguide interface 114, heat spreader 128, chassis 140, cover 142, SMT connector 144, waveguide back short 146, and waveguide opening 148. The SMT connector 150 may, for example, be mounted to the bottom side of the PWB 102 of the package 100. The SMT connector 150 is also connected to the connector 144. The SMT connector 150 and connector 144 may form a stronger mechanical connection than the connection between the connector 144 and mating vias 110 described with reference to FIG. 3. The connector 150 includes a hole through which the end of the connector 144 may extend to form a mechanical interference fit between the external surface of the end of the connector 144 and the internal surface of the hole of the connector 150.

Connector 150, and the movable interference fit between connectors 144 and 150, may act as shock absorbers that provide additional float for the PWBs 102. PWBs can be brittle, rigid, and prone to cracking under the stress of minimal movement. This movement may be caused, for example, by thermal expansion. The movement may also or alternatively be caused due to vibration or other causes. Thus, connector 150 and its associated connection can provide the ability for movement and can absorb stress created between neighboring PWBs 102 in order to prevent the PWBs 102 from cracking. Further, the connection interface of connectors 144 and 150 may provide a convenient interface for removing a PWB from another PWB in order to provide testing of a particular PWB without affecting neighboring components.

Figure 7:
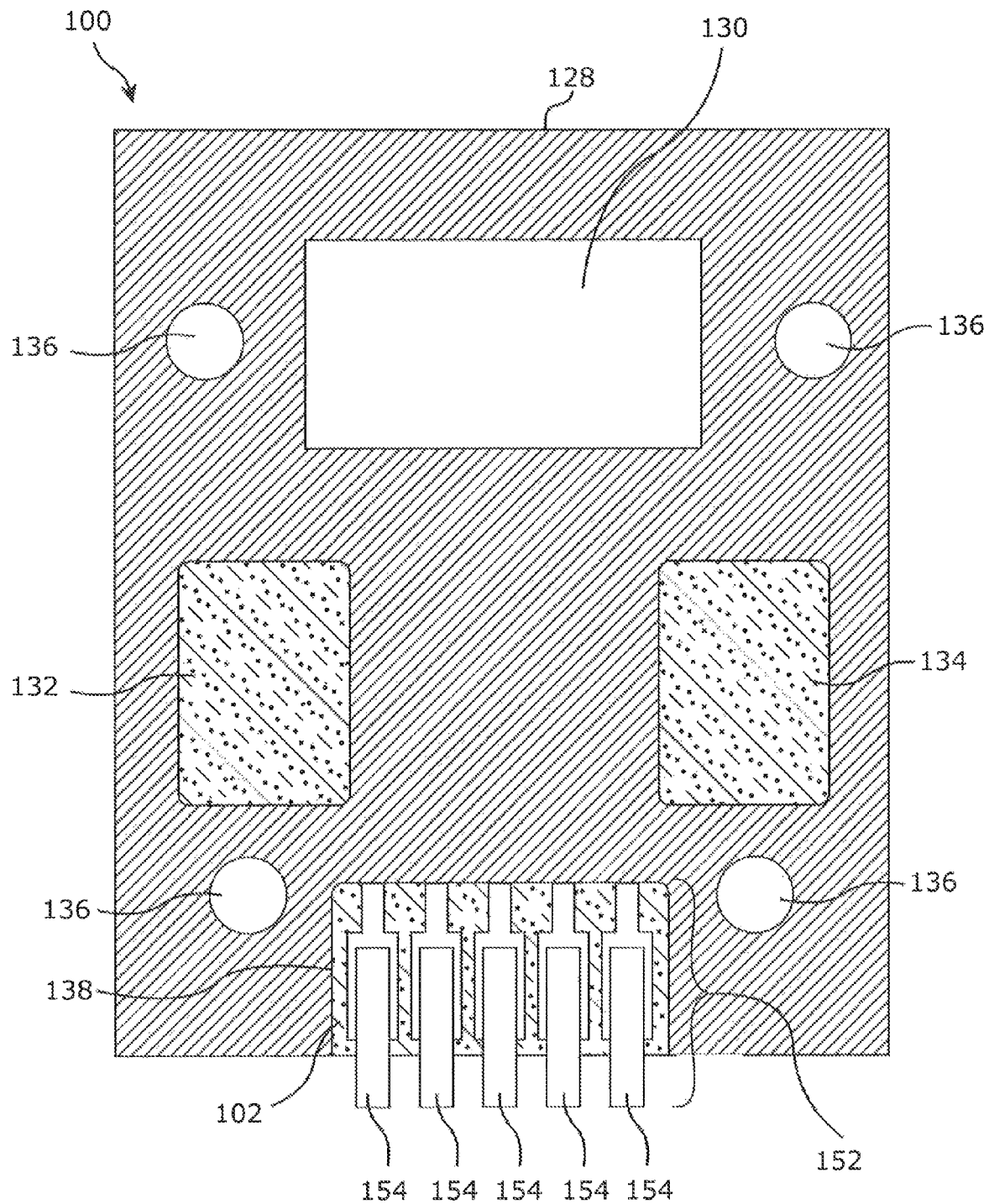
FIG. 7 shows a bottom view of yet another example of a millimeter wave package.

With reference to FIG. 7, a bottom view of an example of a millimeter wave package, such as the package 100, is described. The package 100 shown in FIG. 7 includes components similar to those described with reference to FIGS. 2 and 5, including a heat spreader 128, waveguide space 130, optional openings 132 and 134 for SMT components to be mounted to a PWB 102 (FIG. 4), and one or more holes 136. However, the opening 138 described with reference to FIGS. 2 and 5 is replaced with an alternate opening 138 of different size and location described with reference to FIG. 7. With reference to FIG. 7, the opening 138 may be configured to accommodate a lead frame 152. For example, the lead frame 152 may be mounted to the bottom side of the PWB 102. The lead frame 152 includes at least one trace, lead, electrical contact, or other signal communication path 154. The paths 154 serve to provide electrical communications between multiple packages 100 and 101. The lead frame 152 also provides needed mechanical strength between multiple packages 100 and 101 with a desired amount of float or shock absorption caused by movement between the multiple packages 100 and 101.

Figure 8:
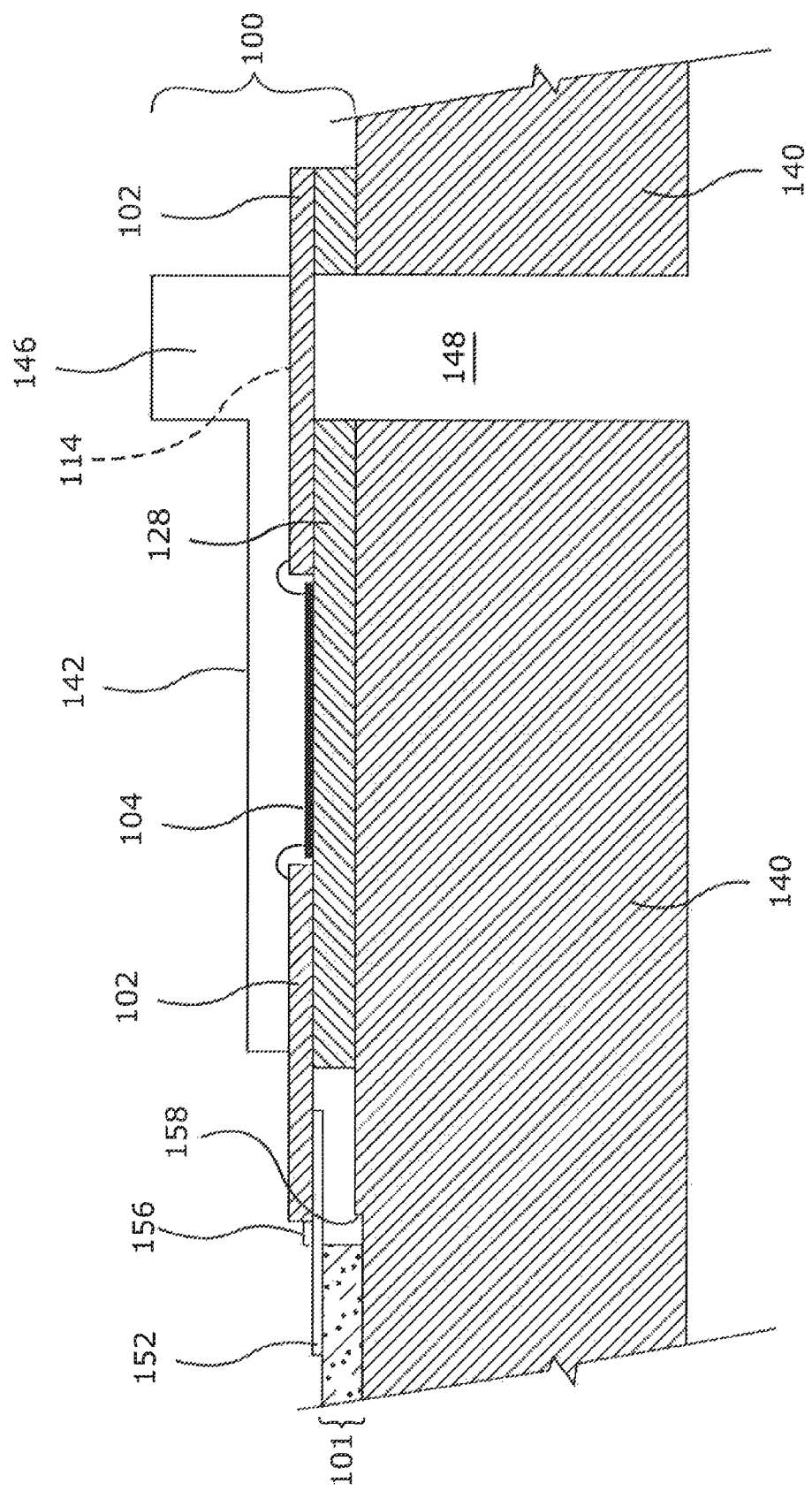
FIG. 8 shows a cross section side view of an example of a millimeter wave package.

With reference to FIG. 8, a side view of an example of at least one millimeter wave package 100 may include components similar to the components described with reference to FIGS. 3 and 6, including a package 100 and mating package 101, PWB 102, MMIC 104, waveguide interface 114, heat spreader 128, chassis 140, cover 142, waveguide back short 146, and waveguide opening 148. The lead frame 152 is also shown mounted to the bottom side of the PWB 102 of the higher package 100 and the top side of the mating package 101. The lead frame 152 provides electrical and mechanical attachment and strength between the mating packages 100 and 101, while also providing needed float or shock absorption to accommodate movement between the packages 100 and 101. The lead frame 152 includes a center section 156 capable of flexing or moving without creating harmful stress upon the neighboring PWBs 102 of the packages 100 and 101. The lead frame 152 is also relatively thin when compared with the connectors 144 and 150 previously described with reference to FIGS. 3 and 6. The relatively thin lead frame 152 permits the chassis 140 to form a smaller step 158, i.e., form a shorter vertical distance, between neighboring packages 100 and 101. The size of a step 158, if any, between neighboring packages may be modified depending upon the type of connector desired, chassis desired, or other desired modifications to factors such as the layout, size, shape, and/or orientation of a series of packages 100 and 101 and/or related components.

Figure 9:
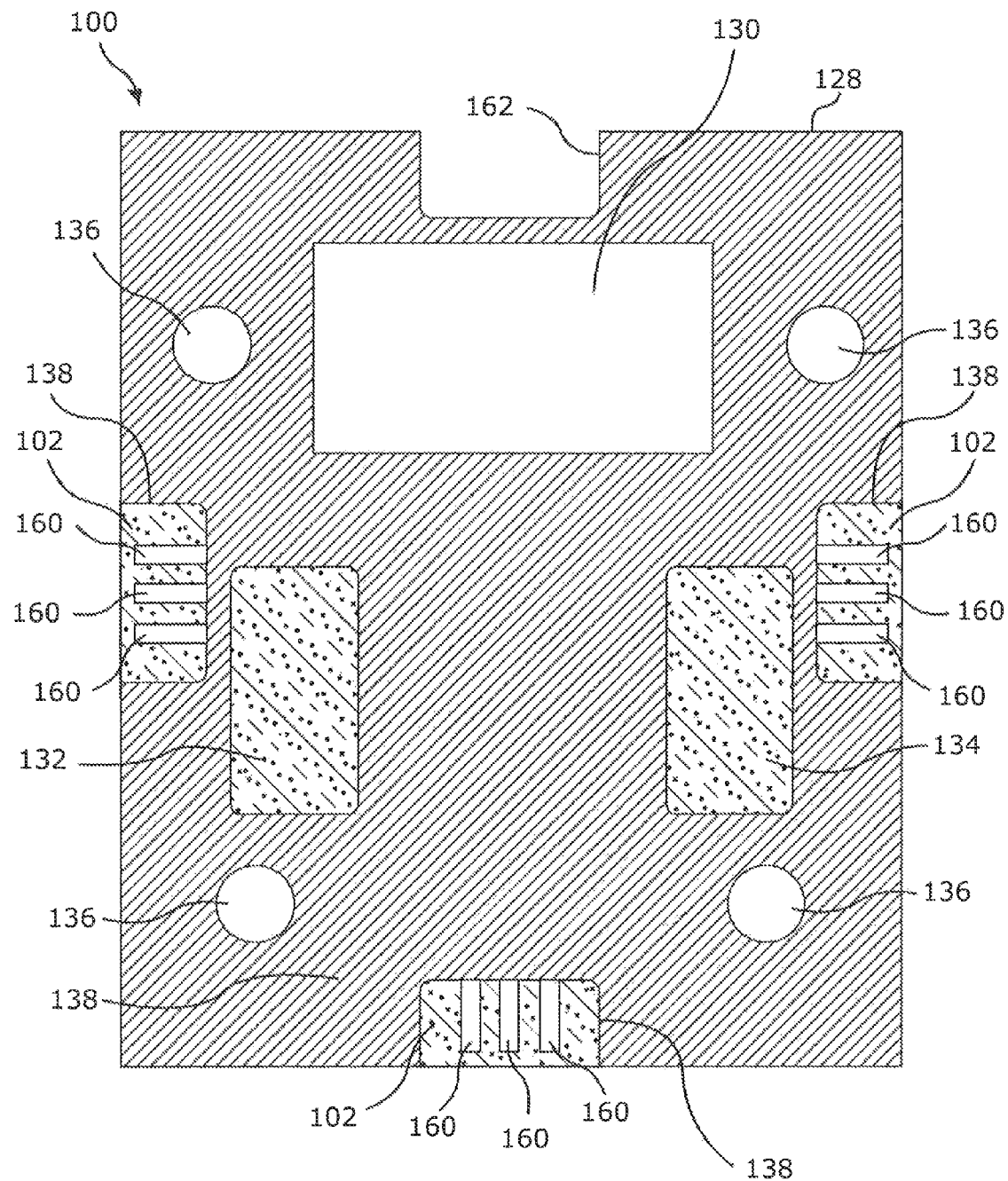
FIG. 9 shows a bottom view of another example of a millimeter wave package.

With reference to FIG. 9, a bottom view of an example of a millimeter wave package 100 such as the package 100 is described with momentary reference to FIG. 4. The package 100 includes components similar to those described with reference to FIGS. 2, 5, and 7, including a heat spreader 128, waveguide space 130, optional openings 132 and 134 for SMT components to be mounted to a PWB 102 (FIG. 4), and one or more holes 136. However, the opening 138 described with reference to FIGS. 2, 5 and 7 may be replaced with multiple alternate openings 138 of different sizes and locations, as described with reference to FIG. 9. The openings 138 of FIG. 9 each accommodate at least one SMT lead 160. The leads 160 are, for example, mounted to the bottom side of the PWB 102. Leads 160 may be leads, traces, or other electrical connectors between multiple packages 100 and 101. The leads 160 may be aligned with corresponding electrical connectors on the top side of a mating PWB 102 using holes 136 or other additional holes and pins forming a mechanical connection and alignment between the PWB 102 and/or heat spreader 128 of the top package 100 and the PWB 102 and/or other component of a mating bottom package 101. Leads 160, or other connections or connectors described herein, may be spring type leads, such as leads capable of connecting one or more packages or other components with or without the use of solder. Thus, in one example, a solder-less spring type lead may connect two packages together.

In one example embodiment, when the pins and holes of two packages 100 and 101 are aligned with each other, the leads 160 will be aligned with their corresponding electrical contacts, forming a mechanical and/or electrical connection. The package 100 shown in FIG. 9 may also include an additional and/or optional opening 162 for accommodating a corresponding support, alignment, attachment, and/or other structure. As with every embodiment described herein, any structural orientations and directions may be altered and/or reversed such that, for example, with reference to the embodiment of FIG. 9, structures attached to a top side may be attached to a bottom side and/or bottom packages may be come top packages, and visa versa.

Figure 10:
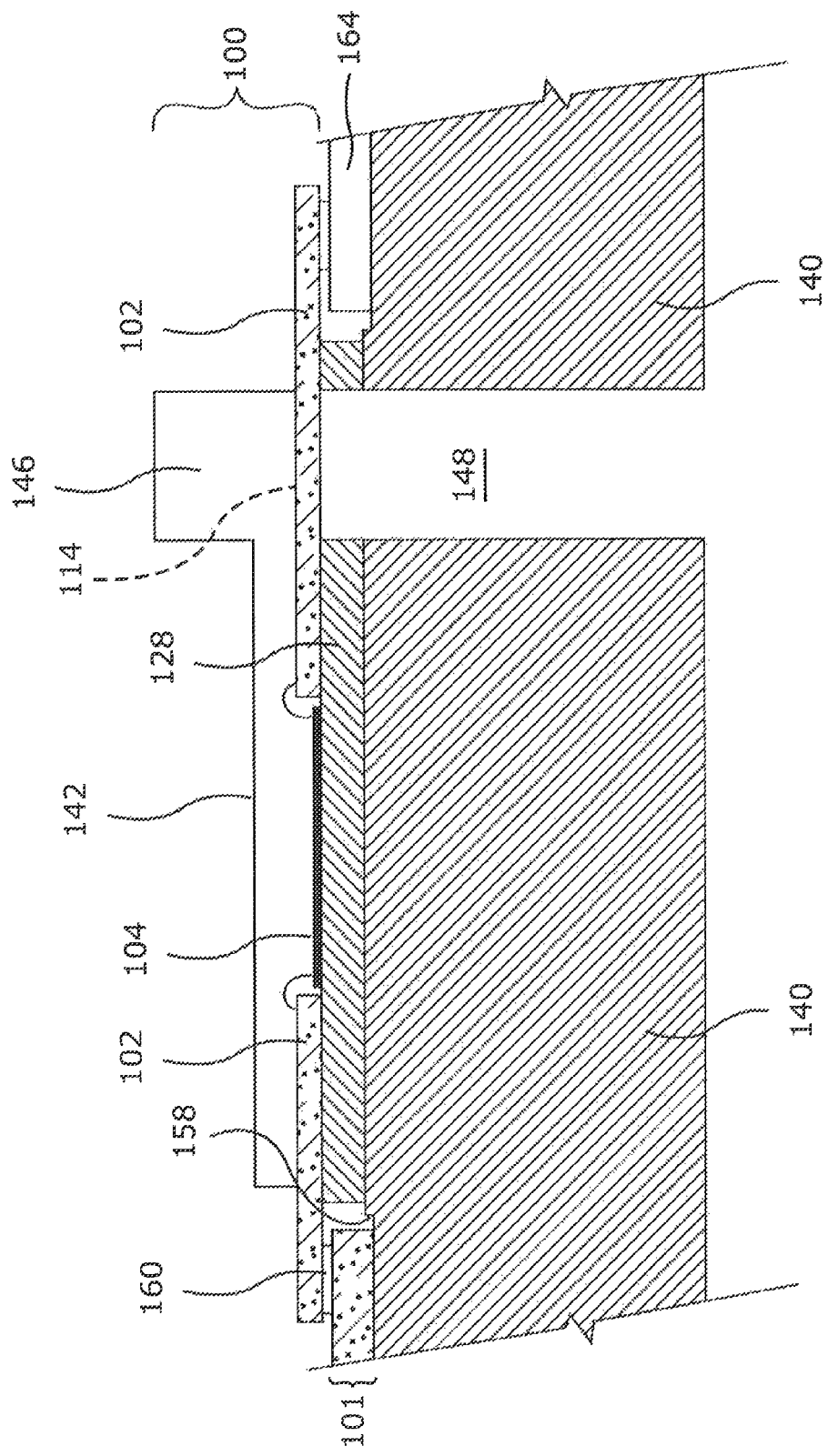
FIG. 10 shows a cross section side view of a further example of a millimeter wave package.

With reference to FIG. 10, a side view of an example of at least one millimeter wave package 100 may include components similar to the components described with reference to FIGS. 3, 6, and 8, including a package 100 and mating package 101, PWB 102, MMIC 104, waveguide interface 114, heat spreader 128, chassis 140, cover 142, waveguide back short 146, and waveguide opening 148. One of the three lead 160 connections is also shown as a SMT attachment between the properly aligned higher package 100 and its lower mating package 101. The remaining two lead 160 connections may be similarly connected to the same or different mating packages 101. Furthermore, package 100 may be connected using similar techniques to two or more mating packages 101, or visa versa.

The relatively thin lead 160 connections may enable the chassis 140 to have a small step 158. In other words, the leads 160 may include a relatively short vertical distance between two electrical contact points, such that a step 158 may be relatively small, which enables packages 100 and 101 to be spaced or located relatively close to each other. The tight and relatively short connection of the lead 160 connections provides little opportunity for movement between connecting packages 100 and 101, which may be beneficial for certain applications. Further, each of the leads 160 may be relatively short, providing a very direct and short pathway between key electrical components of the connecting PWBs 102. The relatively short and direct leads 160 may provide a very low inductance connection with minimal opportunity for parasitic effects upon the electrical connection. A support structure 164 may also be secured to the bottom side of the PWB 102 of the top package 100. The support structure 164 may provide desired mechanical and/or electrical attachment with the PWB 102 and may serve to protect the PWB 102 from fracture or other damage.

Figure 11:
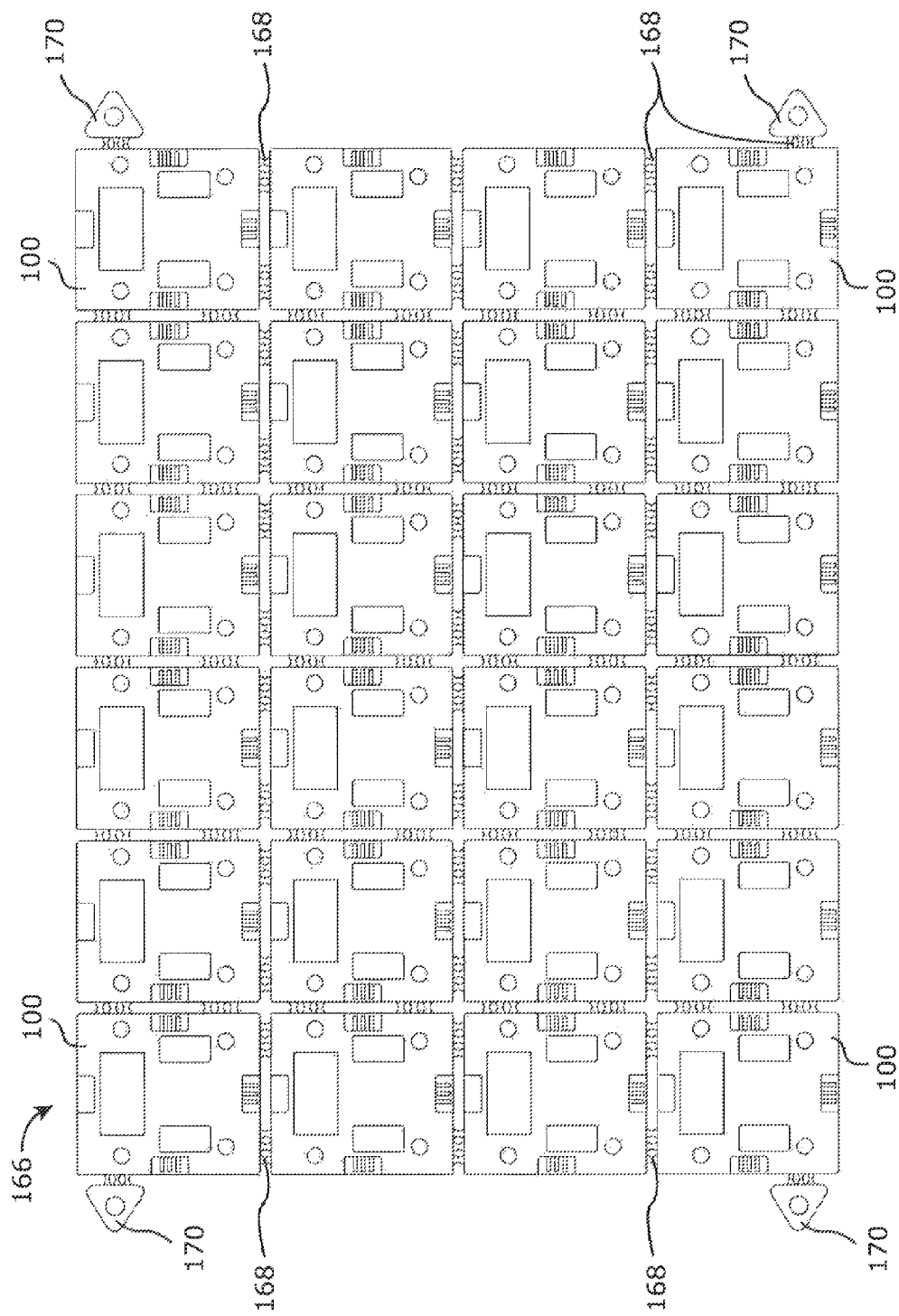
FIG. 11 shows a bottom view of an example of multiple millimeter wave packages in panel form.

With reference to FIG. 11, a bottom view of an example of multiple millimeter wave packages 100 or 101 is described in array or panel 166 form. Any of the package components described with reference to any figure herein may be assembled and/or tested in panel 166 form. Panel 166 form enables a manufacturer to automate manufacturing equipment to rapidly assemble a large number of packages in parallel, simultaneously, or in a coordinated manner at a single automated assembly line station. The panel 166 may include tooling holes 170 or other structure to improve handling of the panel 166 by various machines and equipment used during manufacture and/or testing of the packages on the panel 166.

Traditionally, packages were assembled in a serial process, where only one device could be assembled at a time, bottlenecking the manufacturing process and decreasing output of the total number of devices. However, in accordance with one example, multiple packages 100 may be assembled simultaneously and in parallel to eliminate the bottleneck from the manufacturing process and increase the output of the total number of packages 100 from an automated assembly line. Increased output, or yield, may result in decreased cost for packages 100. At any point during the manufacturing process, for example, after assembly and testing, the packages 100 and/or additional structure, such as tooling holes 170, may be separated into units by tearing perforated break-away tabs 168, by sawing, and/or by other separation process. Thus, the claimed invention provides low-cost and high-volume manufacturing methods applying panel or array formats combined with high-performance materials to realize low-cost, high-power and high-frequency packages.

Further, the packages 100 or 101 of the present disclosure provide significant advantages over other packages. For example, use of the integrated waveguide interface may provide lower losses at the next level of assembly. Also, use of the integrated waveguide may reduce the work that a designer needs to do when integrating the package into a larger system.

In accordance with various embodiments, a package may include a heat spreader, cover, high linearity upconverter with power amplifier, and a waveguide interface. The packages of the present disclosure may include a microwave MMIC package with a waveguide interface that may be manufactured at low cost, and provide both high frequency and high power within a relatively small form factor. For example, high frequency may be greater than about 5 GHz. At about 5 GHz, a waveguide interface of a package may be manufactured to be approximately 1.5 inches wide. At frequencies lower than about 5 GHz, the waveguide interface becomes much larger, making it difficult to include a package with such waveguide interface in a larger assembly. The high power available using the packages of the present disclosure depends upon the frequency used. For example, the packages are capable of producing 0.5 W at 70 GHz. At about 0.5 W, it becomes important to consider adding a heat spreader to the package. As another example, high power may include 4 W at Ku Band frequencies or Ka Band frequencies. Moreover, in Q Band frequencies, high power may be greater than 1 W, greater than 3 W, or greater than 5 W. As another example, high power may be greater than 5 W or 7 W at X Band frequencies. It will be understood that high power may be approximately the highest power levels that are practicable in similar devices (but without the disclosure herein) that have been reported in literature for each band of interest.

Figure 12:
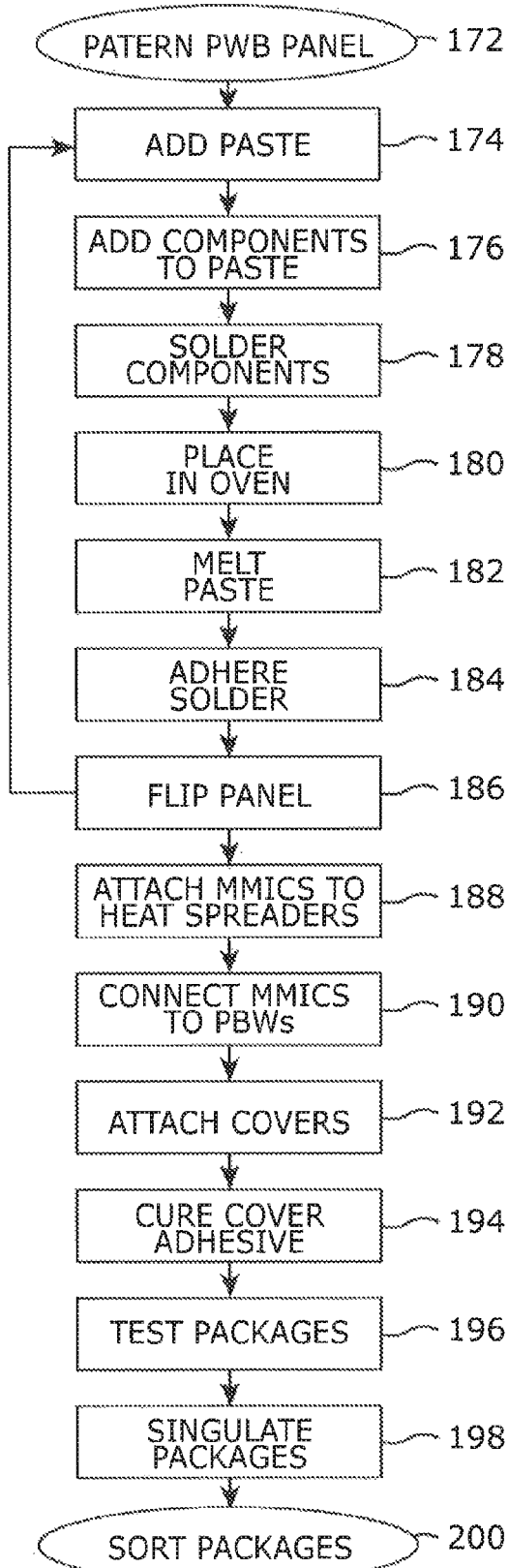
FIG. 12 shows a flow chart of an example of a method of manufacturing a millimeter wave package.

With reference to FIG. 12, a flow chart of an example of a method of manufacturing and/or testing a millimeter wave package in panel form, such as package 100 and/or 101, is described with reference to the elements of the claimed invention described herein. First, an initial and separable panel assembly including at least one PWB unit is provided and patterned (step 172), forming initial cuts and vias, and providing needed etching and plating on the PWB. Paste is then added (step 174) to desired locations on the multiple units of the PWB within the panel. A pick-and-place machine then adds (step 176) resistors, capacitors, metal heat spreader plate, and other mechanical or electrical components to areas containing the paste. One or more of the added components are then soldered (step 178) to the PWB and placed and heated within a reflow oven (step 180) where the paste is melted (step 182) and solder adhered (step 184) to the components and PWB. The panel is then flipped (step 186) and additional components are added in accordance with steps 174 through 184 above until all components, including any desired surface mount technology (SMT), are added to the panel. At least one MMIC is then attached (step 188) to each heat spreader plate using epoxy or similar adhesive. Each MMIC is then wire bonded or otherwise connected (step 190) to each PWB. A cover, such as an RF cover, is then attached (step 192) or adhered to each assembled unit. At this point, an integrated waveguide interface is fully assembled as described herein for each of the multiple packages organized into panel or array format. Epoxy used to adhere the cover to the assembly is cured (step 194) in an oven. Each package is then ready for individual testing (step 196).

Building multiple packages in array or panel format enables efficient testing of the multiple packages either simultaneously or in rapid sequence. Rapid panel and array testing increases manufacturing throughput and reduces costs. Before or after testing, each unit or package is singulated, cut, sawed, or separated (step 198) and packages are individually sorted (step 200) based on each package's response to testing. The individually sorted packages are then sent to additional manufacturers for assembly into other products, are placed on a tape and reel, are placed into trays, or are used as otherwise preferred by a manufacturer.

Assembling components during the example of a manufacturing process described herein will eliminate the need for multiple separate manufacturers to handle and assemble various portions of the packages in order to provide final package assemblies. By providing a simple parallel process for manufacturing multiple packages simultaneously on a single panel of a single assembly line, manufacturing speed and yield is greatly increased, the need for duplicative testing is reduced, cost is reduced, damage in shipping is reduced, and potential for error and mishandling is decreased. Manufacturers benefit from the panel assembly by becoming capable of adding multiple similar or identical components to each of multiple packages on the panel at the same time in a single assembly line. For example, a machine holding multiple MMIC units may place each of the MMIC units on each of multiple panels at the same time, reducing the time typically required by pick-and-place manufacturing machines that place only one MMIC on a package at a time. Such a unified process may empower manufacturers to avoid the need to take an assembled panel and later mount it to a heat spreader that is in turn later mounted to a custom chassis assembly. Rather, all assembly and final testing of the packages may occur at a single location, eliminating the need for duplicative testing each time the package is further assembled by a different manufacturer. The steps described herein may be performed in any order that is useful to one practicing the claimed invention.

Figure 13:
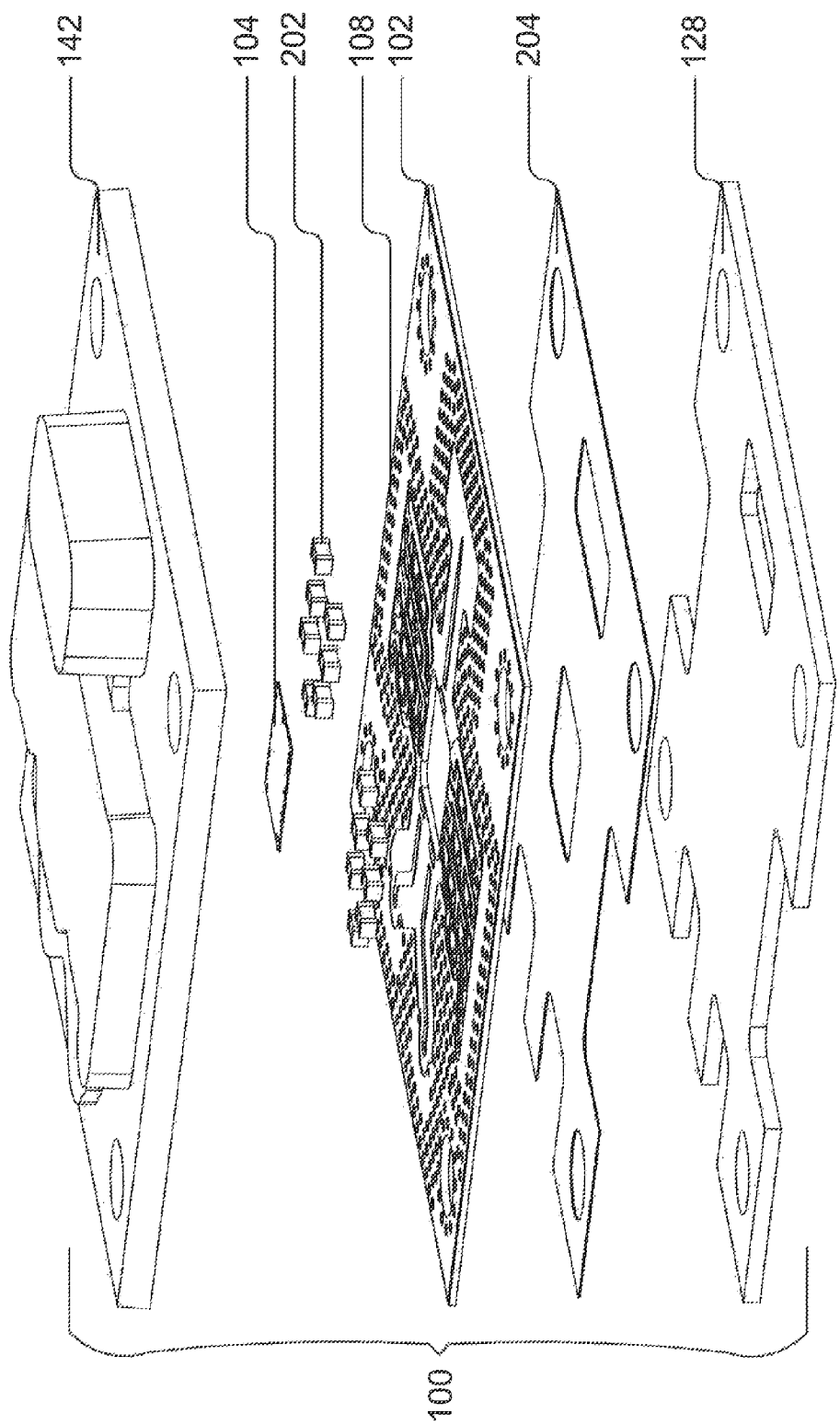
FIG. 13 shows an exploded perspective view of another example of a millimeter wave package.

With reference to FIG. 13, an example of an embodiment of an individual package 100, shown in exploded view, includes a cover 142, multiple SMT components 202, an MMIC 104, a PWB 102, a layer of adhesive 204, and a heat spreader 128. The cover 142 may, for example, be a metal-plated injection molded plastic or may be a dye cast zinc cover that is bonded to the PWB 102 base with a conductive epoxy. The cover 142 may be a pick-and-place component or may be placed as a panel of multiple covers 142 onto multiple PWBs 102. The SMT component 202 may be soldered to the PWB 102, and the MMIC 104 may be mounted directly to the heat spreader 128. The layer of adhesive 204 may be an electrically conductive film adhesive or the equivalent that is approximately two millimeters thick. For example, the adhesive 204 may be an electrically conductive film manufactured by Ablestick, Model No. CF3350. The PWB 102 may be manufactured by Rogers, and may be approximately 0.008 inches thick, such as Model No. R4003, and may include a dielectric with ½ ounce copper on the sides of the PWB 102. The heat spreader 128 may be approximately 20 millimeters thick and manufactured by UNS, Model No. C11000, annealed copper with 30-50 micro-inches of soft gold over a 100-200 micro-inch electroless nickel plate. When mounting the cover 142 to the PWB 102, alignment pins on either the cover 142 or the PWB 102 may align with corresponding holes in order to ensure that the cover 142 and PWB 102 are properly aligned with each other. Various ground vias 108 exist around the perimeter of the surface of the PWB 102 in order to define the RF enclosure. Backside traces on the PWB 102 formed of copper may interconnect RF signals to power.

Figure 14:
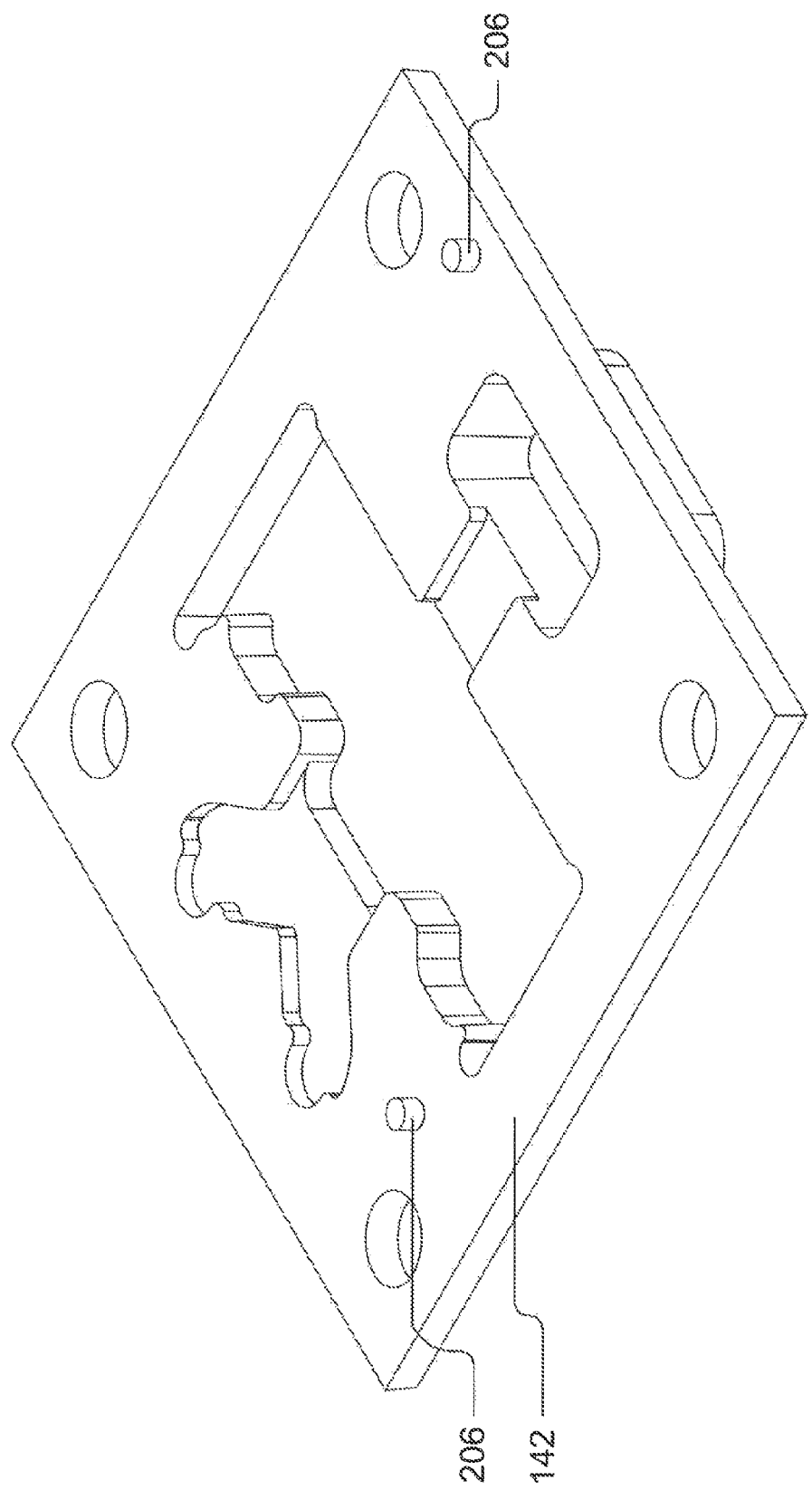
FIG. 14 shows a bottom perspective view of an example of a millimeter wave package cover.

Referring to FIG. 14, a bottom perspective view of the cover 142 shows alignment pins 206. The alignment pins 206 may align with corresponding alignment holes on the PWB 102 to ensure that the cover 142 is properly aligned with PWB 102 during assembly.

Figure 15:
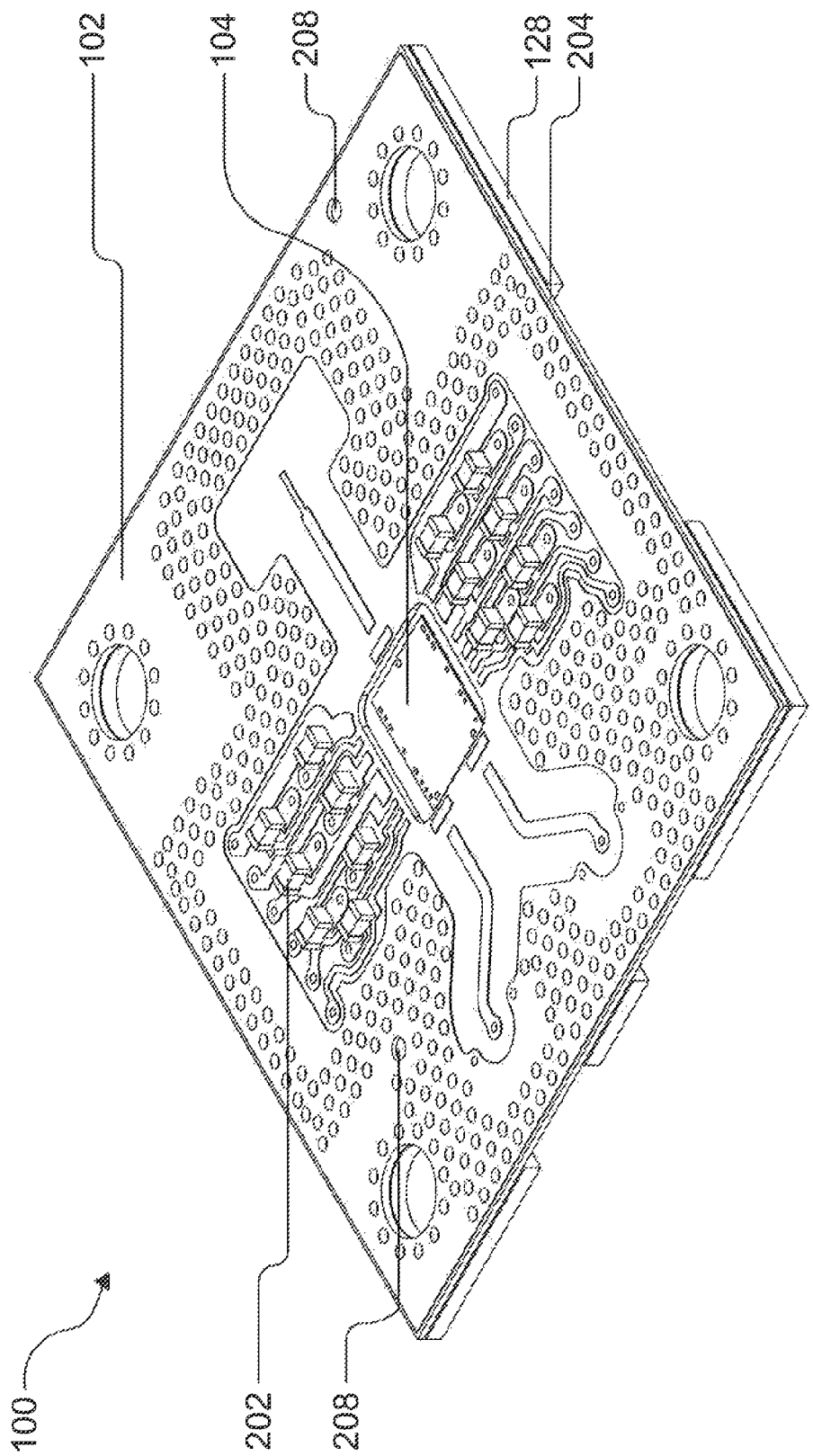
FIG. 15 shows a perspective view of an example of a millimeter wave package without a cover attached.

Referring to FIG. 15, the package 100 is shown in perspective view without a cover 142 attached to the package 100.

Alignment holes 208 are shown on the top surface of the PWB 102. The alignment holes 208 may align with corresponding alignment pins 206 of the cover of 142, as shown in FIG. 14. The PWB 102 shown in FIG. 15 also illustrates SMT components 202 attached to the top surface of the PWB 102.

Figure 16:
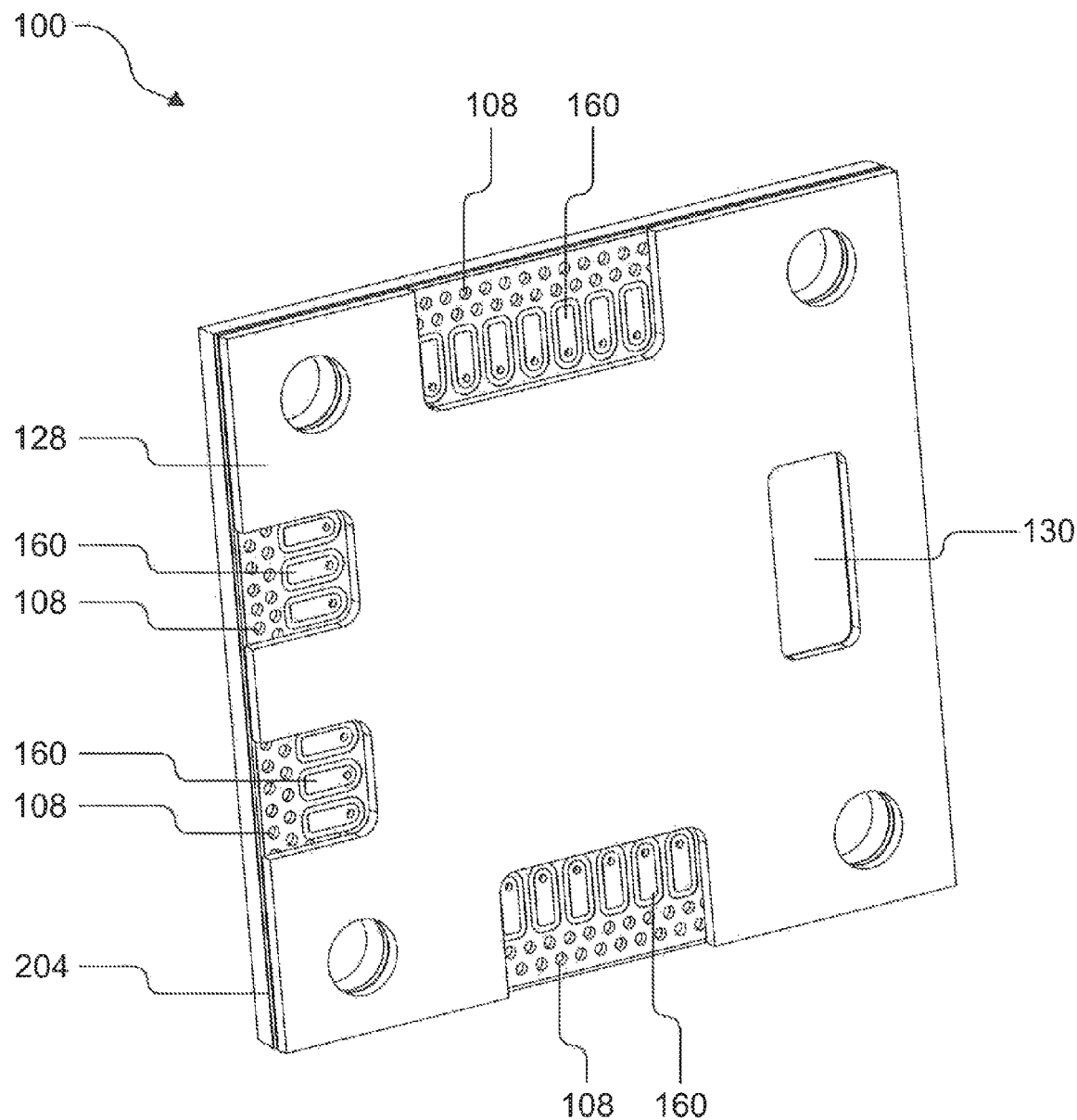
FIG. 16 shows a bottom perspective view of an example of a millimeter wave package.

Referring to FIG. 16, a bottom perspective view of a fully assembled package 100 is shown, illustrating a flat bottom surface of the heat spreader 128. The heat spreader 128 includes multiple openings exposing various regions of the other components of the package 100. For example, a waveguide opening for a waveguide transition 130 is shown providing a waveguide channel for RF waves. Additional openings in the heat spreader 128 expose electrical contact pads, or vias, such as leads 160. The leads 160 may be filled or otherwise protected, insulated, and/or sealed in order to protect the connectability of the leads 160 during sawing or singulating of a package 100 from another package 100. That is, when packages 100 are sawed apart from each other, debris may form in the exposed spaces of the heat spreader 128 and onto the electrical contacts or leads 160, thus inhibiting the leads 160 from establishing a reliable electrical connection with their counterpart electrical components during assembly of the package 100 with another device. Ground vias 108 are similarly exposed through openings of the heat spreader 128. Like the leads 160, the ground vias 108 may also need to be sealed, and likely will be sealed as a result of the adhesive layer 204 formed between the PWB 102 and the heat spreader 128 or by the adhesive layer formed between the PWB 102 and the cover 142.

Figure 17:
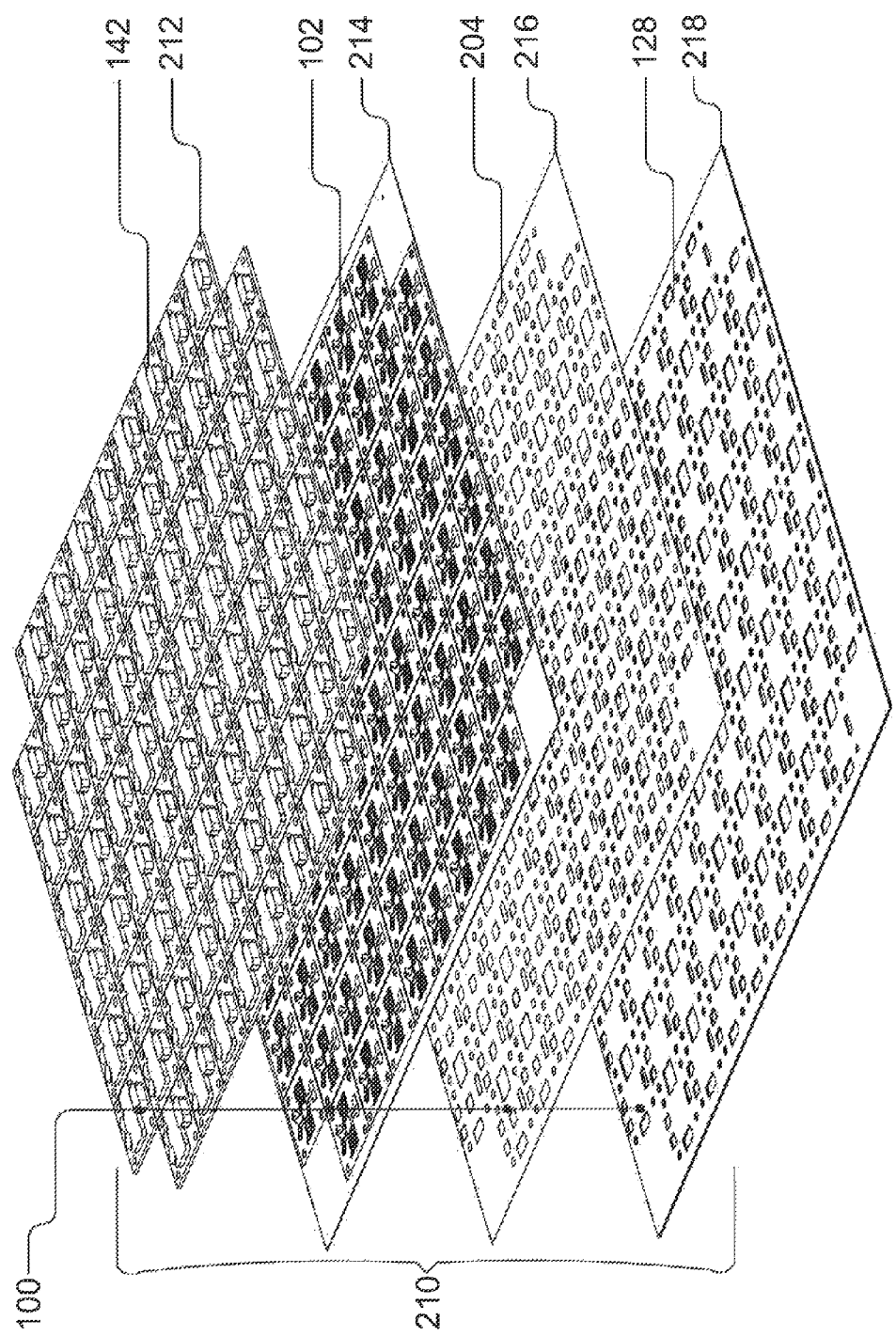
FIG. 17 shows an exploded perspective view of an example of multiple millimeter wave package component panels.

Referring to FIG. 17, a perspective top view of an exploded panel assembly 210 of multiple packages 100 is shown and described. The panel assembly includes a panel or array 212 of individual covers 142, a panel or array 214 of individual PWBs 102, a panel or array 216 of individual adhesive layers 204, and a panel or array 218 of individual heat spreaders 128. During assembly, each panel or array 212, 214, 216 and/or 218 is placed on top of each adjacent panel or array, for example, as shown in FIG. 17. Various fiducials, such as the alignment pins 206 and/or alignment holes 208 may be placed on any of the panels or arrays described herein in order to ensure that each individual component forming an individual package 100 is appropriately aligned with and attached to its adjacent component. These fiducials will help ensure that each package 100 is successfully assembled and functional after assembly. For example, the panel or array 212 of combined covers 142 which may later be singulated or separated, may include a conductive adhesive screened on the underside of the cover array 212. The cover array 212 may then be positioned on top of and secured against the PWB panel or array 214. The bonded cover array 212 and PWB 214 may then be cured in a lamination process in order to ensure flatness and complete bonding across the entire arrays 212 and 214. A similar process may take place with each array or panel in forming a complete panel assembly 210.

In various embodiments, a PWB package may comprise an integrated metal heat spreader and waveguide interface. Stated another way, in various embodiments the package may comprise a heat-spreader base with a PWB that incorporates a built-in waveguide transition. The package may also comprise surface mount technology components. Various embodiments may comprise metal pads on the bottom side of the package that facilitate a reliable solder-less connection through, for example, a spring, pin, or equivalent contact connector. The spring connector may be installed at the next higher assembly level, simplifying manufacturing of the package. Moreover, in various embodiments, the package may be tested in a high-volume test-socket.

Figure 18:
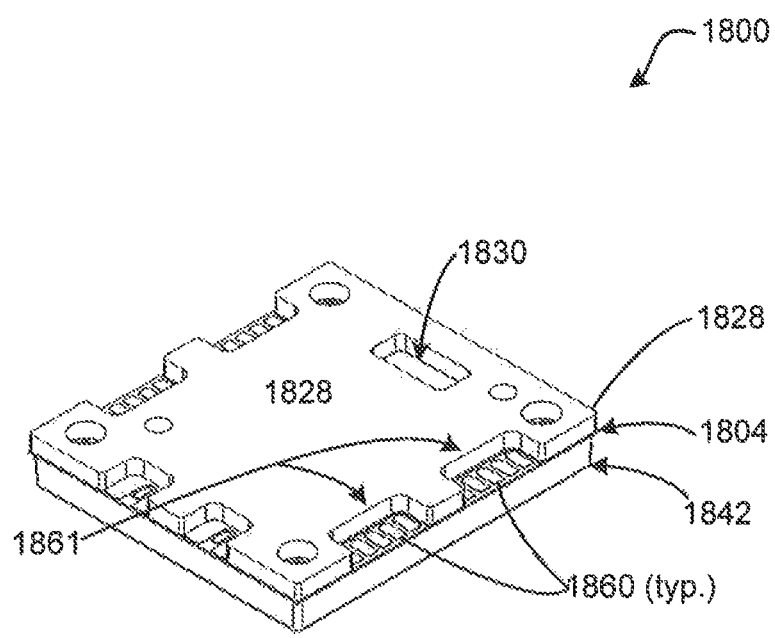
FIG. 18 shows another bottom perspective view of an example of a millimeter wave package.

With reference now to FIG. 18, a bottom perspective view of an example fully assembled package 1800 is shown. In various embodiments, package 1800 may comprise a heat spreader 1828, a printed wiring board (PWB) 1804, and cover 1842. Heat spreader 1828 may include multiple openings exposing various regions of package 1800. For example, a waveguide opening for a waveguide transition 1830 is shown providing a pathway to and/or a portion of a waveguide channel for RF waves. Additional openings in the heat spreader 1828 may expose electrical contact pads, or vias, such as leads 1860. Leads 1860 on PWB 1804 may be accessible via cutouts 1861 in heat spreader 1828.

PWB 1804 may be laminated (or equivalently bonded) to heat-spreader 1828. PWB 1804 may be attached to heat spreader 1828 via a conductive attachment to facilitate a good RF ground for the purpose of improving the waveguide output. The conductive attachment, in various embodiments, may be made through use of a conductive epoxy or direct soldering methods. Also, in various embodiments, package 1800 may comprise ground vias that extend from the top to the bottom of PWB 1804 to facilitate a consistent RF ground throughout the package. In various embodiments, the through vias may be tented. This tenting may provide a barrier preventing outside contaminates from entering the inside of package 1800.

In various embodiments, a conductive sheet epoxy may be used between heat spreader 1828 and PWB 1804. The conductive sheet epoxy may, for example, be die-cut in a shape that approximately matches the shape of heat spreader 1828. The shaped conductive sheet epoxy may then be bonded under high pressure with minimal squeeze-out, thus reducing post bonding cleaning and increasing package yields.

Under high pressure bonding, a bonded PWB-heat spreader structure may have a tendency to bow or warp where there is not enough structural support. Therefore, in various embodiments, the heat spreader may be formed with cutouts distributed, shaped and sized to prevent excessive bowing or warping. In one embodiment, cutouts 1861, for the input/output pads, may be distributed. In other words, a single cutout on a side of heat spreader 1828 may instead be formed as two or more cutouts that are smaller in size than the single cutout. Stated another way, leads 1860 may be arranged in multiple groups. Thus, in various embodiments, areas of package 1800 between a first pad 1860 and a second pad 1860 may be supported by an overlaying heat spreader structure. Similarly, any of the cutout or pass-through sections may be formed such that the high laminating pressures may be more evenly distributed across PWB 1804 via the heat spreader base. In this manner, excessive bowing or warping may be prevented.

Leads 1860 may be filled or otherwise protected, insulated, and/or sealed in order to protect leads 1860 during sawing or singulating of a package 1800 from another package 1800. That is, when packages 1800 are sawed apart from each other, debris may form in the exposed spaces of the heat spreader 1828 and onto the electrical contacts or leads 1860, thus inhibiting the leads 1860 from establishing a reliable electrical connection with their counterpart electrical components during assembly of the package 1800 with another device.

With reference now to FIG. 19, in various embodiments, a spring/pin connection may provide a solder-less interface between leads 1860 of package 1800 and the next higher assembly level. A spring/pin interface assembly 1900 may comprise springs/pins 1910 and a spring/pin structure 1920. Spring/pin interface assembly 1900 may simplify the manufacturing process when placing package 1800 into the next higher assembly level (e.g. 1950). In various embodiments spring/pin structure 1920 may hold spring/pins 1910, and facilitate attaching pins 1910 to package 1800 and to next higher assembly level 1950. Manufacturing process may be simplified, for example, where one package 1800 may easily be swapped out for another package 1800 without de-soldering or breaking any fixed (solder/epoxy) connections and without damaging adjacent components in the assembly. Moreover, in various embodiments, package 1800 can be easily replaced later in the life span of the ultimate product.

Figure 21:
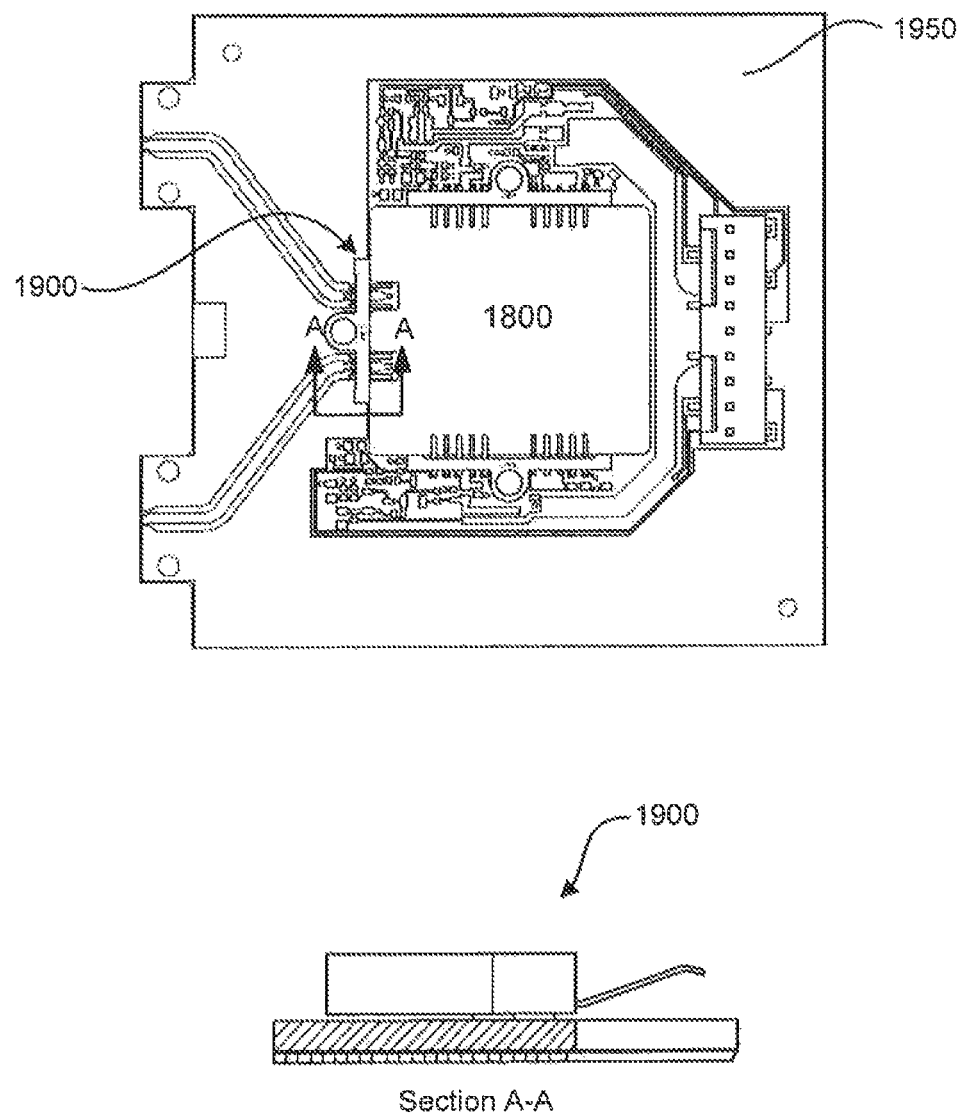
FIG. 21 shows top and side views of an example of a millimeter wave package attached to a next higher level of assembly.

In other embodiments, the spring/pin connection may be optimized for a desired frequency of operation by adjusting the length, height, and overall shape of the leads. Spring/pin 1910 may be configured to contact lead 1860 of package 1800 when package 1800 is placed on the next higher assembly level structure 1950. The other ends of spring/pin 1910 may be connected to RF, power, and/or signal communication lines, such as on a higher level printed wiring board. In various embodiments, spring/pin connector 1910 may be configured with redundant contacts for some or all contacts of some or all of the connections. This redundancy may facilitate a reduction in the chance of intermittent contact of the spring to the PWB leads 1860 (due for example to misalignment, excessive metal-scrub, thermal expansion/contraction, etc.). With momentary reference to FIG. 21, in accordance with various embodiments, package 1800 may be attached to the next higher assembly level 1950 via connection assembly 1900.

Figure 20:
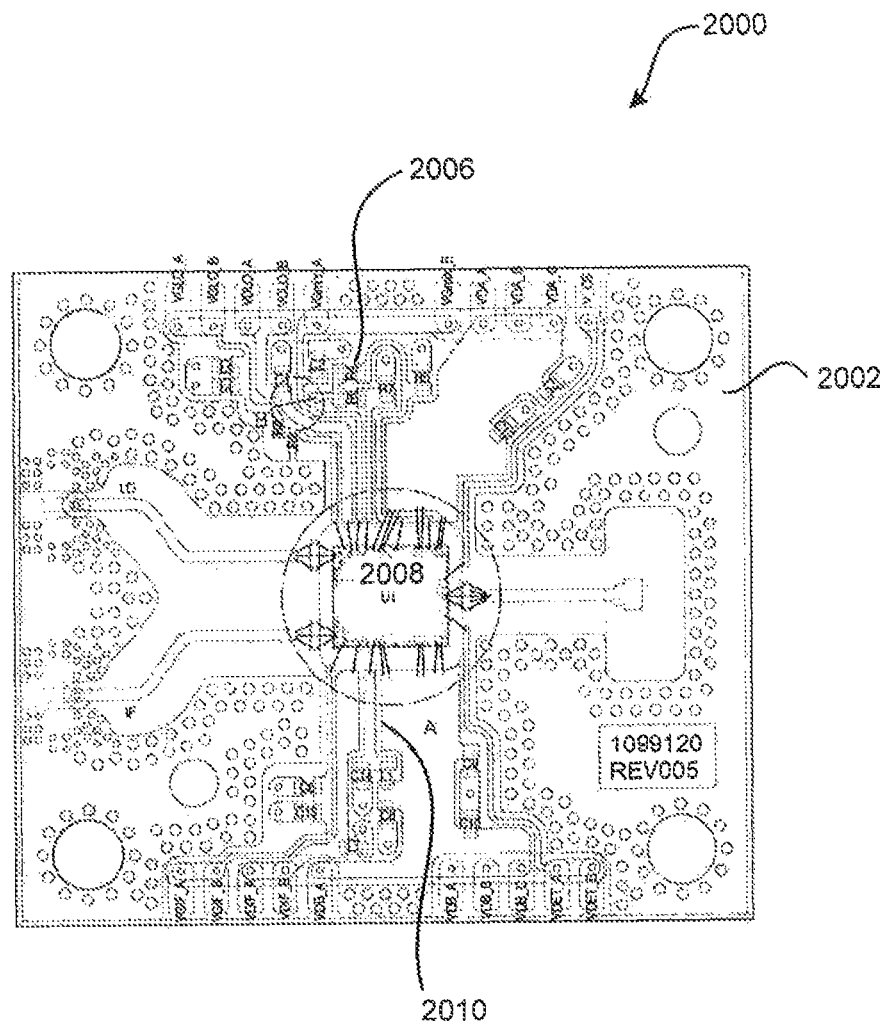
FIG. 20 shows a top view of an example of a printed wiring board of a millimeter wave package.

With reference now to FIG. 20, in accordance with various embodiments a package 2000 is shown without a cover attached to it. Package 2000 may comprise a PWB 2002, a MMIC 2008, and SMT components 2006 attached to the top surface of the PWB 2002. FIG. 20 illustrates bias and signal feeds (e.g., 2010) on PWB 2002. These bias and signal feeds may be wire bonded on one end to MMIC 2008. On the other end, some of these bias and signal feeds may be connected to ground/bias/signal vias which in turn may be connected to leads 1860 as discussed with reference to FIGS. 18 and 19.

In various embodiments, package 1800 may be configured to simplify the next higher assembly process by providing a self-contained device or component that may be suitable for high-volume, low-cost assembly processes. Although described herein in the context of SMT, the invention is not so limited.

Figure 22:
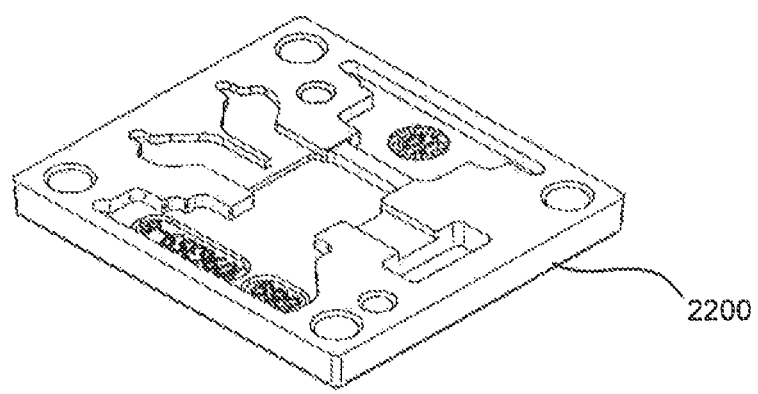
FIG. 22 shows a perspective view of an example cover for a millimeter wave package.

With reference now to FIG. 22, the bottom side of an example cover 2200 is illustrated. To protect the internal components of package 1800 and to provide a conductive waveguide back-short, a metal cover (or equivalently metalized material) may be used. Cover 2200 may be conductively bonded to the top of PWB 1804. Cover 2200 may provide protection from the outside environment and an air cavity surrounding the internal components.

In various embodiments, cover 2200 may facilitate reduction of cavity resonance modes. For example, in one embodiment, cover 2200 may be designed with an internal shape of the cavity having features (e.g., walls/posts/nubs/elevation changes/and the like) to break-up undesired modes. In another embodiment, cover 2200 may comprise an RF absorbing material, such as that sold under the brand name Ecosorb®, located on at least some of the internal portions of cover 2200.

Figure 23:
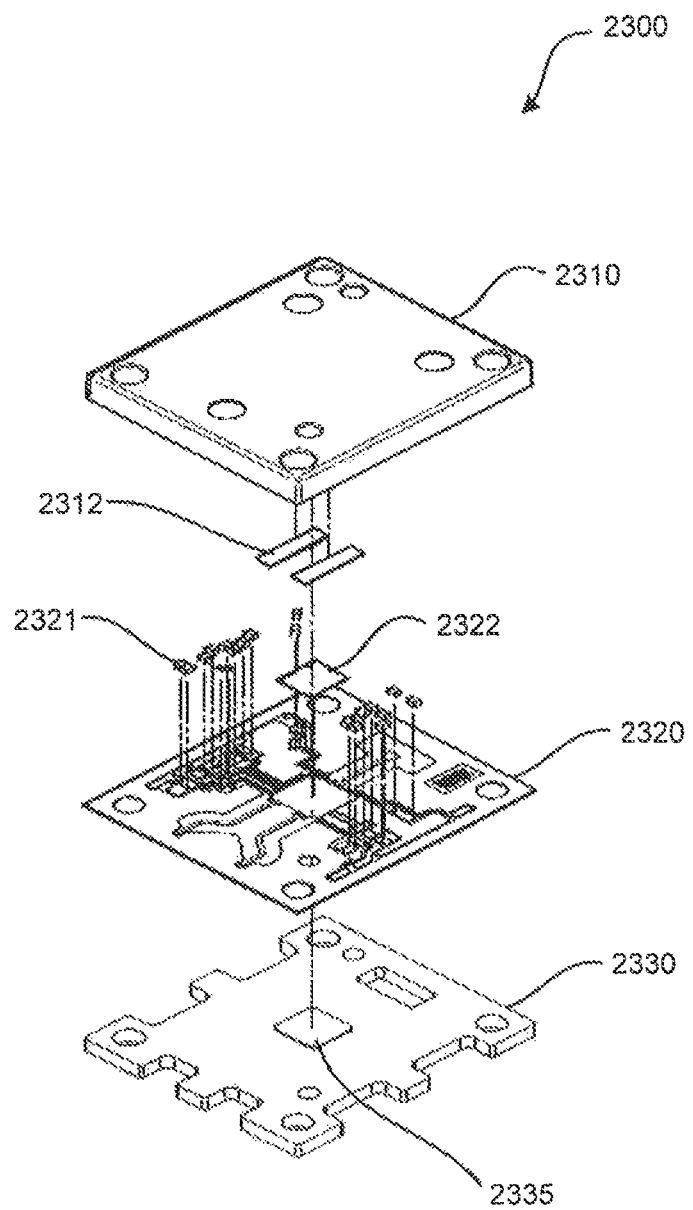
FIG. 23 shows an exploded perspective view of an example of a millimeter wave package.

With reference now to FIG. 23, an exploded view of an example package 2300 is illustrated. Example package 2300 may comprise a cover 2310, a PWB 2320, and a heat spreader 2330. SMT components 2321 and MMIC 2322 may be connected to PWB 2320. PWB 2320 may be attached to heat spreader 2330 and cover 2310 may be attached over PWB 2320. It is noted that in various embodiments, heat spreader 2330 may comprise a pedestal 2335. Pedestal 2335 may be configured to contact MMIC 2322 and to conduct heat away from MMIC 2322 through heat spreader 2330. Cover 2310 may further comprise attached RF absorbing material 2312.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A millimeter wave integrated waveguide interface package device comprising:
   a package comprising a printed wiring board (PWB) and a monolithic microwave integrate circuit (MMIC), wherein the MMIC is in communication with the PWB;
   a waveguide interface integrated with the package;
   a heat spreader attached to the PWB; and
   first and second leads on the PWB, wherein the heat spreader comprises first and second cutouts on a first side of the device, and wherein the first and second cutouts are individually located to reveal the respective first and second leads.

2. The device of claim 1, wherein the device is configured to operate at frequencies greater than about 5 GHz, and at a power greater than about 0.5 W.

3. The device of claim 1, wherein the MMIC is in contact with the heat spreader, and wherein the MMIC is electrically connected to the PWB via wire bonds.

4. The device of claim 1, further comprising:
   a component mounted to the PWB; and
   wherein the MMIC is secured to the heat spreader and electrically connected to the PWB.

5. The device of claim 1, wherein the device is assembled in panel form with additional millimeter wave devices.

6. The device of claim 1, wherein the MMIC includes a radio frequency (RF) output, and wherein the device further comprises an RF probe situated in the waveguide interface and in communication with the RF output of the MMIC.

7. The device of claim 1, wherein the heat spreader is attached to a first side of the PWB, wherein the MMIC is in electrical communication with a second side of the PWB, and wherein the second side is opposite the first side.

8. A millimeter wave integrated waveguide interface package device comprising:
   a package comprising a printed wiring board (PWB) and a monolithic microwave integrate circuit (MMIC), wherein the MMIC is in communication with the PWB;
   a first and a second leads located on a first side of the PWB, wherein the first and second leads are configured for solder-less connection to a next higher assembly level;
   a waveguide interface integrated with the package;
   wherein the package is adapted to operate at high frequency and high power, and wherein high frequency includes frequencies greater than about 5 GHz, and wherein high power includes power greater than about 0.5 W; and wherein the MMIC includes a radio frequency (RF) output, and wherein the device further comprises an RF probe situated in the waveguide interface and in communication with the RF output of the MMIC.

9. The device of claim 8, wherein the solder-less connection between the next higher assembly level and the first and second leads is made by a spring connector.

10. The device of claim 8, further comprising a heat spreader, wherein the heat spreader is attached to a first side of the PWB, wherein the MMIC is in electrical communication with a second side of the PWB, and wherein the second side is opposite the first side.

11. A millimeter wave integrated waveguide interface package device comprising:
   a package comprising a printed wiring board (PWB) and a monolithic microwave integrate circuit (MMIC), wherein the MMIC is in communication with the PWB; and
   a heat spreader attached to the PWB, wherein the MMIC is in contact with the heat spreader and the MMIC is electrically connected to the PWB via wire bonds; and
   a waveguide interface integrated with the package;
   wherein the package is adapted to operate at high frequency and high power, and wherein high frequency includes frequencies greater than about 5 GHz, and wherein high power includes power greater than about 0.5 W.

12. The device of claim 11, further comprising first and second leads forming part of the PWB, wherein the heat spreader comprises first and second cutouts on a first side of the device, and wherein the first and second cutouts are individually located to reveal the respective first and second leads.

13. The device of claim 11, wherein the heat spreader is attached to a first side of the PWB, wherein the MMIC is electrically connected to the PWB on a second side of the PWB, and wherein the second side is opposite the first side.

14. A millimeter wave integrated waveguide interface package device, comprising:
   a monolithic microwave integrate circuit (MMIC);
   a printed wiring board (PWB), wherein the PWB comprises a MMIC opening, and wherein the PWB comprises a w opening;
   a heat spreader attached to one side of the PWB, wherein the MMIC is located in thermal communication with the heat spreader, and wherein the MMIC is located within the MMIC opening in the PWB, and wherein the MMIC is in electrical communication with the PWB; and
   a radio frequency (RF) probe in contact with the PWB, wherein the RF probe is electrically connected to an output of the MMIC, and wherein the RF probe extends out over the waveguide interface opening so as to be configured to launch an RF signal through the waveguide interface opening; and
   an RF cover, wherein the RF cover is attached to a first side of the PWB, wherein the first side is opposite the side of the PWB that is attached to the heat spreader, and wherein the RF cover comprises a waveguide back short located over the waveguide interface opening.

15. The device of claim 14, wherein the MMIC is in electrical communication with a side of the PWB that is opposite the one side of the PWB to which the heat spreader is attached.

16. The device of claim 14, wherein the device is adapted to operate at high frequency and high power, and wherein high frequency includes frequencies greater than about 5 GHz, and wherein high power includes power greater than about 0.5 W.

17. A millimeter wave integrated waveguide interface package device, comprising:
   a monolithic microwave integrate circuit (MMIC);
   a printed wiring board (PWB), wherein the PWB comprises a MMIC opening, and wherein the PWB comprises a waveguide interface opening;
   a heat spreader attached to one side of the PWB, wherein the MMIC is located in thermal communication with the heat spreader, and wherein the MMIC is located within the MMIC opening in the PWB, and wherein the MMIC is in electrical communication with the PWB;
   a radio frequency (RF) probe in contact with the PWB, wherein the RF probe is electrically connected to an output of the MMIC, and wherein the RF probe extends out over the waveguide interface opening so as to be configured to launch an RF signal through the waveguide interface opening;
   a first lead and a second lead, wherein the first and second leads are both located on a first surface of the PWB and wherein the heat spreader is also attached to the first surface of the PWB;
   a first cutout in the heat spreader; and
   a second cutout in the heat spreader, wherein the first and second cutouts are respectively associated with the first and second leads, and wherein the first and second leads are configured for solder-less connection to a next higher assembly level.

18. The device of claim 17, wherein the device is assembled in panel form with additional millimeter wave devices.

19. The device of claim 17, wherein the device is adapted to operate at high frequency and high power, and wherein high frequency includes frequencies greater than about 5 GHz, and wherein high power includes power greater than about 0.5 W.

* * * * *

UNITED STATES PATENT AND TRADEMARK OFFICE
CERTIFICATE OF CORRECTION

PATENT NO.        : 8,872,333 B2                                    Page 1 of 1
APPLICATION NO.   : 13/311235
DATED             : October 28, 2014
INVENTOR(S)       : Noel A. Lopez et al.

It is certified that error appears in the above-identified patent and that said Letters Patent is hereby corrected as shown below:

In the Claims,

In Column 15, line 43, "waveguide interface" before the word "opening" is excluded in error and should be added in the place of "w" that was included in error.

Signed and Sealed this
Seventeenth Day of February, 2015

Michelle K. Lee
*Deputy Director of the United States Patent and Trademark Office*